(12) United States Patent
Haderbache et al.

(10) Patent No.: US 12,688,340 B2
(45) Date of Patent: Jul. 21, 2026

(54) INFERENCE METHOD AND INFORMATION PROCESSING APPARATUS

(71) Applicant: FUJITSU LIMITED, Kawasaki (JP)

(72) Inventors: Amir Haderbache, Kawasaki (JP); Koichi Shirahata, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 978 days.

(21) Appl. No.: 17/717,184

(22) Filed: Apr. 11, 2022

(65) Prior Publication Data

US 2023/0011312 A1     Jan. 12, 2023

(30) Foreign Application Priority Data

Jul. 8, 2021 (JP) .................................. 2021-113566

(51) Int. Cl.
*G06F 30/23* (2020.01)
*G06F 17/15* (2006.01)
(Continued)

(52) U.S. Cl.
CPC ............ *G06F 30/23* (2020.01); *G06F 17/153* (2013.01); *G06F 17/16* (2013.01); *G06F 30/27* (2020.01); *G06N 3/04* (2013.01)

(58) Field of Classification Search
CPC ........ G06F 30/23; G06F 17/153; G06F 17/16; G06F 30/27; G06F 2119/14; G06N 3/04; G06N 3/042; G06N 3/0464; G06N 3/08
See application file for complete search history.

(56) References Cited

U.S. PATENT DOCUMENTS

| | | | |
|---|---|---|---|
| 5,754,181 A | 5/1998 | Amdursky et al. | |
| 2016/0179992 A1 | 6/2016 | Van der Velden | |

(Continued)

FOREIGN PATENT DOCUMENTS

| | | |
|---|---|---|
| JP | 2016-146169 A | 8/2016 |
| JP | 2021-002342 A | 1/2021 |

OTHER PUBLICATIONS

Genna et al. "Speeding-up Finite Element analyses by replacing the linear equation solver with a Boundary Element code. Part 1: 2D linear elasticity", Computers & Structures, vol. 88, Issues 13-14, pp. 845-858, ISSN 0045-7949, and available at https://doi.org/10.1016/j.compstruc.2010.04.003. (Year: 2010).*

(Continued)

*Primary Examiner* — Sanchita Roy
(74) *Attorney, Agent, or Firm* — Fujitsu Intellectual Property Center

(57) ABSTRACT

An information processing apparatus stores mesh data including a plurality of nodes and a plurality of edges and boundary condition data indicating force applied to an object represented by the mesh data. The information processing apparatus calculates a stiffness matrix including a plurality of stiffness values corresponding to the plurality of edges and a force vector including a plurality of force values corresponding to the plurality of nodes. The information processing apparatus generates feature data from the stiffness matrix and the force vector. The information processing apparatus infers a plurality of displacement amounts corresponding to the plurality of nodes by performing a convolutional operation on the feature data in accordance with a connection relationship of the plurality of nodes.

8 Claims, 23 Drawing Sheets

(51) Int. Cl.

| | | |
|---|---|---|
| *G06F 17/16* | (2006.01) | |
| *G06F 30/27* | (2020.01) | |
| *G06N 3/04* | (2023.01) | |

(56) References Cited

U.S. PATENT DOCUMENTS

| | | | |
|---|---|---|---|
| 2017/0032068 A1 | 2/2017 | Iorio | |
| 2020/0401672 A1 | 12/2020 | Van der Velden | |
| 2021/0004719 A1* | 1/2021 | Dupont De Dinechin | ................. G06N 20/00 |

OTHER PUBLICATIONS

Liang Liang et al., "A Deep Learning Approach to Estimate Stress Distribution: a Fast and Accurate Surrogate of Finite-element Analysis", Journal of The Royal Society, Interface, vol. 15: 20170844, Issue 138, pp. 1-10, Jan. 2018 (Total 10 pages).
Kai-Hung Chang et al., "Learning to Simulate and Design for Structural Engineering", arXiv:2003.09103v3 [cs.LG], Aug. 12, 2020 (Total 17 pages).
Nobuyuki Umetani et al., "Learning Three-Dimensional Flow for Interactive Aerodynamic Design", ACM Transactions on Graphics, vol. 37, No. 4, Article 89, Aug. 2018, pp. 1-10 (Total 10 pages).
Masanobu Horie et al., "Isometric Transformation Invariant and Equivariant Graph Convolutional Networks", arXiv:2005.06316v3 [cs.LG], Dec. 21, 2020, pp. 1-25 (Total 25 pages).
Extended European Search Report dated Oct. 19, 2022 for corresponding European Patent Application No. 22169269.2, 13 pages.
Whalen, Eamon Jasper: "Enhancing surrogate models of engineering structures with graph-based and physics-informed learning", Jun. 1, 2021, pp. 1-81, XP055970157, URL:https://dspace.mit.edu/bitstream/handle/1721.1/139609/whalen_ewhalen_sm_cose_2021_thesis.pdf.
Garg, Isha et al., "A Low Effort Approach to Structured CNN Design Using PCA", arxiv.org, Cornell University Library, 201 Olin Library Cornell University Ithaca, NY 14853, Jan. 10, 2020, XP081575731, DOI: 10.1109/ACCESS.2019.2961960, pp. 1-14.
Ross, Elissa et al., "Using Graph Neural Networks to Approximate Mechanical Response on 3D Lattice Structures", Oct. 1, 2019, XP055970158, pp. 466-485, URL:https://thinkshell.fr/wp-content/uploads/2019/10/AAG2020_24 Ross.pdf.
Pellicer-Valero, Oscar J. et al., "Real-time biomechanical modeling of the liver using Machine Learning models trained on Finite Element Method simulations", Expert Systems With Applications, Elsevier, Amsterdam, NL, vol. 143, Nov. 8, 2019, XP086033662, ISSN: 0957-4174, DOI: 10.1016/J.ESWA.2019.113083, pp. 1-12.
European Patent Office Action date Oct. 17, 2025 for corresponding European Patent Application No. 22169269.2, 10 pages.
Chinese Office Action issued Mar. 27, 2026 for corresponding Chinese Patent Application No. 202210445677.0, with English Translation, 19 pages. *Please note NPL Nos. 1 and 2 were previously cited in an IDS filed on Nov. 2, 2022.*

* cited by examiner

FEATURE DATA (n NODES × 9 DIMENSIONS)　　32

| COORDINATES | FORCE | MATERIAL DENSITY | ELASTIC MODULUS | POISSON'S RATIO |
|---|---|---|---|---|
| [vx1, vy1, vz1] | [fx1, fy1, fz1] | M1 | E1 | P1 |
| [vx2, vy2, vz2] | [fx2, fy2, fz2] | M2 | E2 | P2 |
| ... | ... | ... | ... | ... |

31

GRAPH CONVOLUTIONAL NETWORK (GCN)

33

| DISPLACEMENT AMOUNTS |
|---|
| [dx1, dy1, dz1] |
| [dx2, dy2, dz2] |
| ... |

DISPLACEMENT DATA
(n NODES × 3 DIMENSIONS)

FIG. 5

FEATURE MATRIX (28 × 255)

154

|     | 1 | 2 | ⋯ | 10 | 11 | ⋯ | 244 | 245 | ⋯ | 253 | 254 | 255 |
|-----|------|------|------|------|-------|------|------|------|------|------|------|------|
| v1  | 3.00 | 2.00 | ⋯ | 2.50 | 2.00 | ⋯ | 0.00 | 0.00 | ⋯ | 0.00 | 0.00 | 1.50 |
| v2  | 2.00 | 1.80 | ⋯ | 2.00 | −0.50 | ⋯ | 0.00 | 0.00 | ⋯ | 0.0 | 0.0 | 1.50 |
| ⋮   | ⋮ | ⋮ |  | ⋮ | ⋮ |  | ⋮ | ⋮ |  | ⋮ | ⋮ | ⋮ |
| v28 | 0.00 | 0.00 | ⋯ | 0.00 | 0.00 | ⋯ | −0.50 | −1.00 | ⋯ | 0.00 | 0.00 | 0.00 |

⇩ NORMALIZATION
(Maximum Absolute Scaler)

FEATURE MATRIX (28 × 255)

155

|     | 1 | 2 | ⋯ | 10 | 11 | ⋯ | 244 | 245 | ⋯ | 253 | 254 | 255 |
|-----|------|------|------|------|-------|------|------|------|------|------|------|------|
| v1  | 1.00 | 1.00 | ⋯ | 1.00 | 1.00 | ⋯ | 0.00 | 0.00 | ⋯ | 0.00 | 0.00 | 0.50 |
| v2  | 0.67 | 0.90 | ⋯ | 0.80 | −0.25 | ⋯ | 0.00 | 0.00 | ⋯ | 0.00 | 0.00 | 0.50 |
| ⋮   | ⋮ | ⋮ |  | ⋮ | ⋮ |  | ⋮ | ⋮ |  | ⋮ | ⋮ | ⋮ |
| v28 | 0.00 | 0.00 | ⋯ | 0.00 | 0.00 | ⋯ | −1.00 | −1.00 | ⋯ | 0.00 | 0.00 | 0.00 |

⇩ PRINCIPAL COMPONENT ANALYSIS

FEATURE MATRIX (28 × 20)

156

|     | 1 | 2 | ⋯ | 19 | 20 |
|-----|-------|------|------|------|-------|
| v1  | 0.00 | 0.00 | ⋯ | 0.00 | 0.00 |
| v2  | 0.50 | 1.00 | ⋯ | 0.00 | −0.50 |
| ⋮   | ⋮ | ⋮ |  | ⋮ | ⋮ |
| v28 | −3.00 | 2.50 | ⋯ | 0.00 | 1.00 |

FIG. 19

FEATURE
MATRIX
n × m  (m < 9n+3)

DISPLACEMENT
MATRIX
n × 3

48

| NUMBER OF NODES n | NUMBER OF FEATURES $9n+3$ | NUMBER OF NON-ZERO FEATURES | NUMBER OF FEATURES AFTER PCA |
|---|---|---|---|
| 28 | 255 | 106 | 20 |
| 60 | 543 | 127 | 40 |
| 130 | 1173 | 120 | 89 |
| 260 | 2343 | 138 | 173 |
| 516 | 4647 | 138 | 341 |
| 1035 | 9318 | 156 | 692 |
| 2238 | 20145 | 156 | 1511 |
| 4473 | 40260 | – | 2998 |
| 9162 | 82461 | – | 6546 |

FIG. 21

INFERENCE METHOD AND INFORMATION PROCESSING APPARATUS

CROSS-REFERENCE TO RELATED APPLICATION

This application is based upon and claims the benefit of priority of the prior Japanese Patent Application No. 2021-113566, filed on Jul. 8, 2021, the entire contents of which are incorporated herein by reference.

FIELD

The embodiments discussed herein relate to an inference method and an information processing apparatus.

BACKGROUND

A structural analysis simulation is known as a computer simulation. In the structural analysis simulation, there are cases in which deformation of an object is calculated from the shape of the object and the force applied to the object. In a computer simulation, there are cases in which a finite element method (FEA) is used as a numerical analysis method.

For example, in the finite element method, a plurality of nodes are arranged in a space including an object, and the space is divided into small areas by the edges connecting the nodes. In the finite element method, a variable representing a physical quantity is assigned to an individual node, and a coefficient matrix that discretely expresses an inter-node relationship is calculated in accordance with governing equations representing physical laws. In addition, in the finite element method, a right-hand vector is calculated based on boundary conditions. In the finite element method, a simultaneous equation defined by the coefficient matrix and the right-hand vector is solved in accordance with an iterative method, such as a conjugate gradient (CG) method.

In a structural analysis simulation in which deformation of an object is calculated by using the finite element method, a variable representing a displacement amount is assigned to an individual node. A relationship between a displacement amount and force is expressed by a simultaneous equation indicating that a product of a stiffness matrix and a displacement vector matches a force vector. Thus, in this structural analysis simulation, the stiffness matrix and the force vector are calculated based on governing equations and boundary conditions, and the displacement vector is calculated by solving the simultaneous equation.

There has been proposed a system in which a stiffness matrix and a load vector are calculated from mesh data in accordance with the finite element method, a coefficient matrix A and a right-hand vector f are generated from the stiffness matrix and the load vector, and a solution vector x that satisfies Ax=f is calculated. In addition, there has been proposed a surrogate model generation method in which the number of dimensions is reduced by performing principal component analysis (PCA) and a high-order derivative is approximated by a neural network.

There has also been proposed a finite element method simulation that calculates an approximate solution from geometric data and boundary conditions by using a multi-layer neural network, assigns an approximate solution to a variable, and warm-starts a finite element method solver. In addition, there has been proposed a structural analysis simulation that performs machine learning by using simulation results of different geometric data as training data and that performs a finite element method while modifying material characteristics.

See, for example, U.S. Pat. No. 5,754,181, Japanese Laid-open Patent Publication No. 2016-146169, U.S. Patent Application Publication No. 2017/0032068, and Japanese Laid-open Patent Publication No. 2021-2342.

A linear solver that solves a large-scale simultaneous equation in accordance with an iterative method may result in a large calculation amount and a long execution time. Thus, when a structural analysis simulation that calculates deformation of an object is performed, the displacement amounts of the individual nodes may be inferred in a simplified manner, without following a rigorous finite element method. To infer the displacement amounts, convolutional operations may be performed on the inter-node feature values. For example, an inference model, such as a convolutional neural network that performs convolutional operations, may be used.

In this case, from which input data the displacement amounts need to be inferred is important. Depending on the selected input data, it could be difficult to infer the displacement amounts with a practical accuracy. For example, directly inferring the displacement amounts of the individual nodes from boundary condition data, which corresponds to the input data in the finite element method, could result in a low inference accuracy.

SUMMARY

In one aspect, there is provided a non-transitory computer-readable recording medium storing therein a computer program that causes a computer to execute a process including: calculating, based on first mesh data including a plurality of nodes and a plurality of edges connecting the plurality of nodes and first boundary condition data indicating force applied to an object represented by the first mesh data, a first stiffness matrix including a plurality of stiffness values corresponding to the plurality of edges and a first force vector including a plurality of force values corresponding to the plurality of nodes; generating first feature data from the first stiffness matrix and the first force vector; and inferring a plurality of displacement amounts corresponding to the plurality of nodes by performing a convolutional operation on the first feature data in accordance with a connection relationship of the plurality of nodes represented by the first mesh data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 illustrates an example of displacement amount prediction based on a graph convolutional network;

FIG. 19 illustrates an example of normalization and principal component analysis performed on a feature matrix;

FIG. 21 illustrates examples of a per-node feature number with respect to the number of nodes;

DESCRIPTION OF EMBODIMENTS

Hereinafter, embodiments will be described with reference to drawings.

First Embodiment

A first embodiment will be described.

Figure 1:
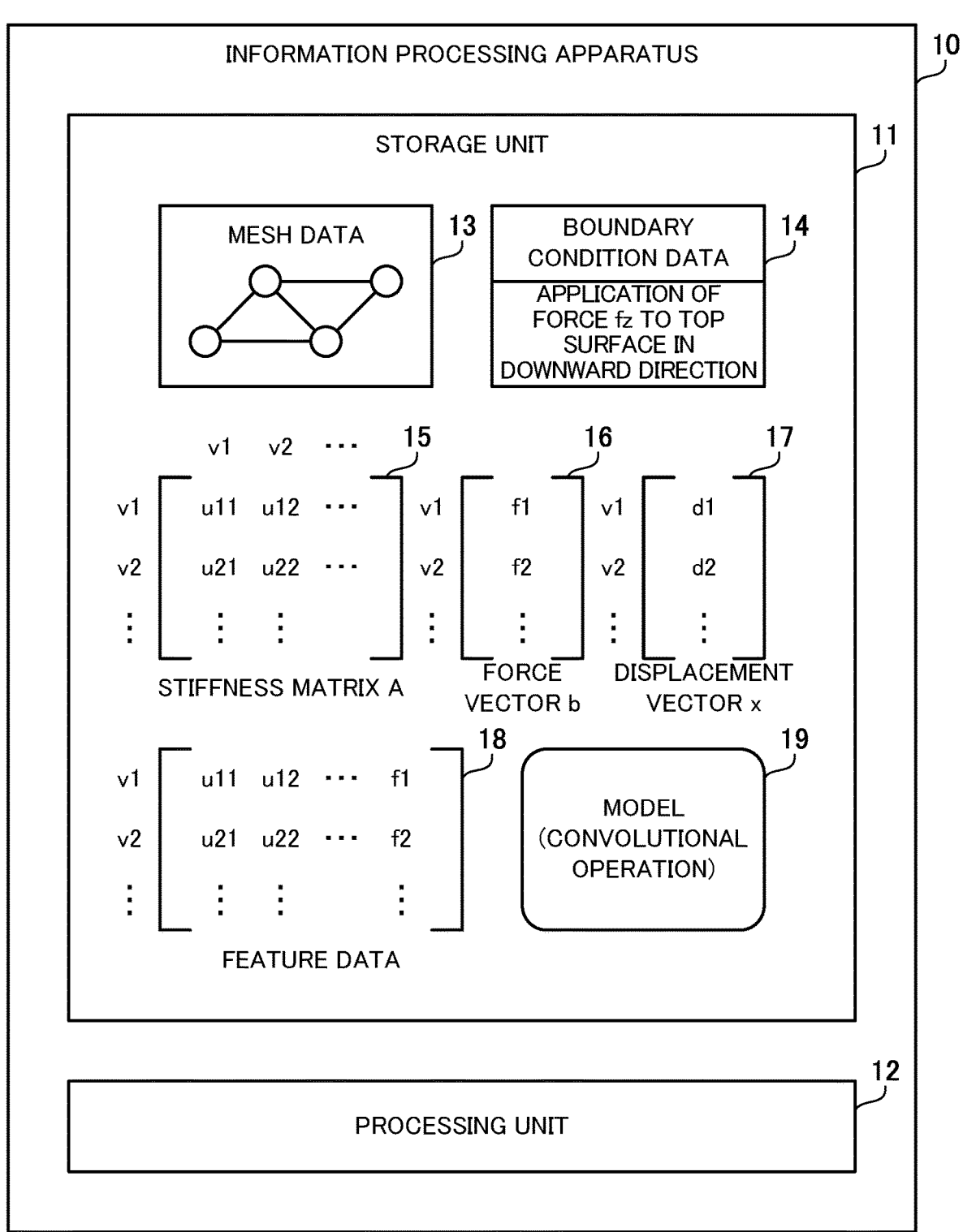
FIG. 1 illustrates an information processing apparatus according to a first embodiment.

FIG. 1 illustrates an information processing apparatus according to the first embodiment.

This information processing apparatus 10 performs a structural analysis simulation to analyze deformation of an object caused by the force applied to the object. Instead of directly solving a generated large-scale simultaneous equation in accordance with a finite element method, the information processing apparatus 10 infers the solution by using a model such as a neural network. The information processing apparatus 10 may be a client apparatus or a server apparatus. The information processing apparatus 10 may be referred to as a computer, an inference apparatus, or a simulation apparatus.

The information processing apparatus 10 includes a storage unit 11 and a processing unit 12. The storage unit 11 may be a volatile semiconductor memory such as a random access memory (RAM) or a non-volatile storage such as a hard disk drive (HDD) or a flash memory. The processing unit 12 is, for example, a processor such as a central processing unit (CPU), a graphics processing unit (GPU), or a digital signal processor (DSP). The processing unit 12 may include an application-specific electronic circuit such as an application-specific integrated circuit (ASIC) or a field programmable gate array (FPGA). For example, the processor executes a program stored in a memory such as a RAM (which may be the storage unit 11). A group of processors may be called a "multiprocessor" or simply a "processor".

The storage unit 11 stores mesh data 13 and boundary condition data 14. The mesh data 13 represents the shape of an object and includes a plurality of nodes and a plurality of edges connecting these nodes. The space including the object is divided by the nodes and edges in the mesh data 13 into a plurality of small areas. The space including the object may be a two-dimensional (2D) plane or a three-dimensional (3D) space. Examples of the shape of the individual small area include a triangle, a rectangle, a tetrahedron, and a hexahedron. The mesh data 13 may be automatically generated by mesh generation software from computer-aided design (CAD) data representing the outline of the object.

The boundary condition data 14 represents the force applied to the object represented by the mesh data 13. The force applied from the outside of the object may be referred to as load or external force. The boundary condition data 14 may define the application range of the force on a surface of the object, the direction of the force, and the magnitude of the force. For example, the boundary condition data 14 defines that force fz is applied to the top surface of the object in a downward direction.

The processing unit 12 calculates a stiffness matrix 15 (a stiffness matrix A) and a force vector 16 (a force vector b) based on the mesh data 13 and the boundary condition data 14. The stiffness matrix 15 and the force vector 16 are a matrix and a vector that are also used in a finite element method. In the finite element method, a displacement vector 17 (a displacement vector x) that satisfies a simultaneous equation $Ax=b$ is calculated by using an iterative method such as a conjugate gradient method. As will be described below, instead of directly solving this simultaneous equation, the processing unit 12 infers the displacement vector 17 in a simplified manner.

The stiffness matrix 15 includes a plurality of discretized stiffness values corresponding to the plurality of edges represented by the mesh data 13. For example, the rows in the stiffness matrix 15 correspond to the nodes, the columns in the stiffness matrix 15 correspond to the nodes, and the intersection point of a row and a column corresponds to an edge connecting two nodes. For example, from the coordinates of two nodes connected by an edge, the material of the object, and the governing equations about deformation of the object caused by the force applied to the object, the processing unit 12 calculates a stiffness value between the two nodes. For example, the processing unit 12 uses parameters such as an inter-node length, a cross-sectional area, and an elastic modulus. In addition, the processing unit 12 uses an equilibrium equation indicating that zero is obtained when all the force is synthesized, a strain-displacement relation, and a stress-strain relation as the governing equations.

The force vector 16 includes a plurality of discretized force values corresponding to the plurality of nodes represented by the mesh data 13. The force vector 16 may be referred to as a stress vector, an external force vector, or a load vector. For example, the processing unit 12 calculates a force value applied to each of the plurality of nodes based on the boundary condition data 14. The force values applied to the nodes located outside the range specified by the boundary condition data 14 may be considered as zero. In addition, the force values applied to the internal nodes located inside the object may be considered as zero. The force values applied to the nodes on an object surface within the range specified by the boundary condition data 14 may represent the force specified by the boundary condition data 14.

The displacement vector 17 includes a plurality of discretized displacement amounts corresponding to the plurality of nodes represented by the mesh data 13. A displacement amount represents how much the corresponding node is shifted by the force applied to the object. These displacement amounts are unknown values and correspond to variables assigned to the nodes. Thus, the displacement vector 17 is a vector in which a plurality of variables assigned to the plurality of nodes are listed.

The processing unit 12 generates feature data 18 from the stiffness matrix 15 and the force vector 16. The feature data 18 is input data used to infer the displacement amounts. The feature data 18 may include a plurality of feature vectors corresponding to the plurality of nodes. In addition, the feature data 18 may be a feature matrix obtained by coupling the stiffness matrix 15 and the force vector 16. In this case, the processing unit 12 may rearrange the elements in the stiffness matrix 15 and the elements in the force vector 16. For example, the processing unit 12 may arrange a stiffness value and a force value about a single node in a single row.

In addition, the feature values included in the feature data 18 may be the stiffness values included in the stiffness matrix 15 and the force values included in the force vector 16 or may be other values obtained by modifying the stiffness values and the force values. For example, the processing unit 12 may normalize the feature values included in the plurality of feature vectors corresponding to the plurality of nodes. The processing unit 12 may perform principal component analysis to reduce the number of dimensions of the plurality of feature vectors.

The processing unit 12 infers the displacement amounts of the individual nodes by performing convolutional operations on the feature data 18 in accordance with a connection relationship among the nodes represented by the mesh data 13. The processing unit 12 may enter the feature data 18 to a model 19 that performs the convolutional operations. The model 19 may be previously generated by machine learning. The model 19 may be a convolutional neural network (CNN) including at least one convolutional layer. Alternatively, the model 19 may be a graph convolutional network (GCN) including at least one graph convolutional layer that performs so-called graph convolutional operations.

In a convolutional operation, for example, the processing unit 12 updates the feature vector of a certain node by using the feature vector of a different node connected to the certain node. For example, the processing unit 12 multiplies the feature vector of the different node by a coefficient and adds the product to the feature vector of the above node. A kernel including the coefficient is determined through machine learning, for example. The processing unit 12 outputs the inferred displacement vector 17. The processing unit 12 may store the displacement vector 17 in a non-volatile storage, may display the displacement vector 17 on a display device, or may transmit the displacement vector 17 to a different information processing apparatus.

As described above, the information processing apparatus 10 according to the first embodiment performs a structural analysis simulation to calculate deformation of an object, based on the mesh data 13 that represents the shape of the object and the boundary condition data 14 that represents the force applied to the object. As a result, the information processing apparatus 10 is able to provide information useful in designing the shape of the object, such as in designing industrial components.

In addition, the information processing apparatus 10 infers the displacement vector 17 from the feature data 18, instead of calculating the displacement vector 17 by solving the simultaneous equation Ax=b. For example, the information processing apparatus 10 infers the displacement amounts of the individual nodes by entering the feature data 18 to the model 19. As a result, the calculation amount of the structural analysis simulation is reduced, and the execution time thereof is shortened.

In addition, the information processing apparatus 10 calculates the stiffness matrix 15 and the force vector 16, which are also used in the simultaneous equation Ax=b, and generates the feature data 18 from the stiffness matrix 15 and the force vector 16. Next, the information processing apparatus 10 infers the displacement amounts of the individual nodes by performing convolutional operations on the feature data 18 in accordance with a connection relationship among the nodes. As a result, the inference accuracy of the displacement vector 17 is improved, and the inference result is used practically.

For example, it is possible to create the input data of the model 19 directly from the mesh data 13 and the boundary condition data 14, which is the input data in a finite element method. For example, feature values such as the coordinates of the nodes, material parameters such as the elastic modulus, and the force represented by the boundary condition data 14 may be included in the feature vector of the individual node. However, there is a weak association between these feature values and the displacement amounts of the individual nodes, and it is difficult to infer the displacement amounts from these feature values. In addition, there are cases in which useful feature values are not given to the nodes in a range in which the force is not applied or to the internal nodes. In contrast, there is a strong association between the feature values based on the stiffness matrix 15 or the force vector 16 and the displacement amounts of the individual nodes, and use of these feature values makes it easier to infer the displacement amounts.

Second Embodiment

Next, a second embodiment will be described.

An information processing apparatus 100 according to a second embodiment performs a structural analysis simulation to analyze deformation of an object caused by external force. In addition, the information processing apparatus 100 generates a model through machine learning and predicts a calculation result of a finite element method by using the generated model. Note that the machine learning and the model may be used by a different information processing apparatus. For example, the information processing apparatus 100 is used for designing industrial components. The information processing apparatus 100 may be a client apparatus or a server apparatus. The information processing apparatus 100 may be referred to as a computer, an inference apparatus, a simulation apparatus, a design apparatus, or a machine learning apparatus.

Figure 2:
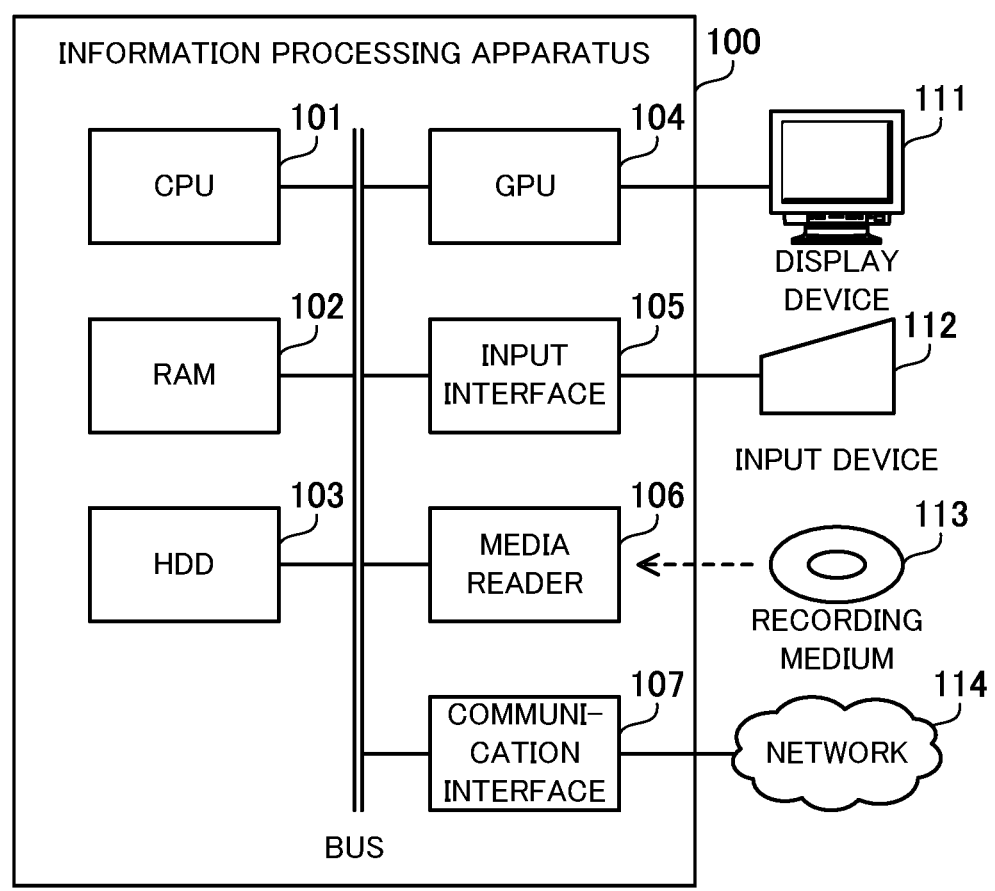
FIG. 2 illustrates a hardware example of an information processing apparatus according to a second embodiment.

FIG. 2 illustrates a hardware example of the information processing apparatus according to the second embodiment.

The information processing apparatus 100 includes a CPU 101, a RAM 102, an HDD 103, a GPU 104, an input interface 105, a media reader 106, and a communication interface 107, which are connected to a bus. The CPU 101 corresponds to the processing unit 12 according to the first embodiment. The RAM 102 or the HDD 103 corresponds to the storage unit 11 according to the first embodiment.

The CPU 101 is a processor that executes program commands. The CPU 101 loads a program and at least part of the data stored in the HDD 103 to the RAM 102 and executes the program. The information processing apparatus 100 may include a plurality of processors. A group of processors may be referred to as a multi-processor or simply "a processor".

The RAM 102 is a volatile semiconductor memory that temporarily stores the program executed by the CPU 101 and the data used for calculation by the CPU 101. The information processing apparatus 100 may include a different kind of volatile memory other than a RAM.

The HDD 103 is a non-volatile storage that stores an operating system (OS), middleware, software programs such as application software, and data. The information processing apparatus 100 may include a different kind of non-volatile storage, such as a flash memory or a solid state drive (SSD).

The GPU 104 performs image processing in coordination with the CPU 101. The GPU 104 outputs an image to a display device 111 connected to the information processing apparatus 100. The display device 111 is, for example, a cathode ray tube (CRT) display, a liquid crystal display (LCD), an electro luminescence (EL) display, or a projector. A different kind of output device such as a printer may be connected to the information processing apparatus 100.

The input interface 105 receives an input signal from an input device 112 connected to the information processing apparatus 100. The input device 112 is, for example, a mouse, a touch panel, or a keyboard. A plurality of input devices may be connected to the information processing apparatus 100.

The media reader 106 is a reading device that reads a program and data recorded in a recording medium 113. The recording medium 113 is, for example, a magnetic disk, an optical disc, or a semiconductor memory. Examples of the magnetic disk include a flexible disk (FD) and an HDD. Examples of the optical disc include a compact disc (CD) and a digital versatile disc (DVD). The media reader 106 copies the program and data read from the recording medium 113 to another recording medium such as the RAM 102 or the HDD 103. The read program may be executed by the CPU 101.

The recording medium 113 may be a portable recording medium and may be used for distribution of the program and data. The recording medium 113 and the HDD 103 may each be referred to as a computer-readable recording medium.

The communication interface 107 is connected to a network 114 and communicates with other information processing apparatuses via the network 114. The communication interface 107 may be a wired communication interface connected to a wired communication device, such as a switch or a router. Alternatively, the communication interface 107 may be a wireless communication interface connected to a wireless communication device, such as a base station or an access point.

The following description will be made on a structural analysis simulation for analyzing deformation of an object caused by external force.

Figure 3:
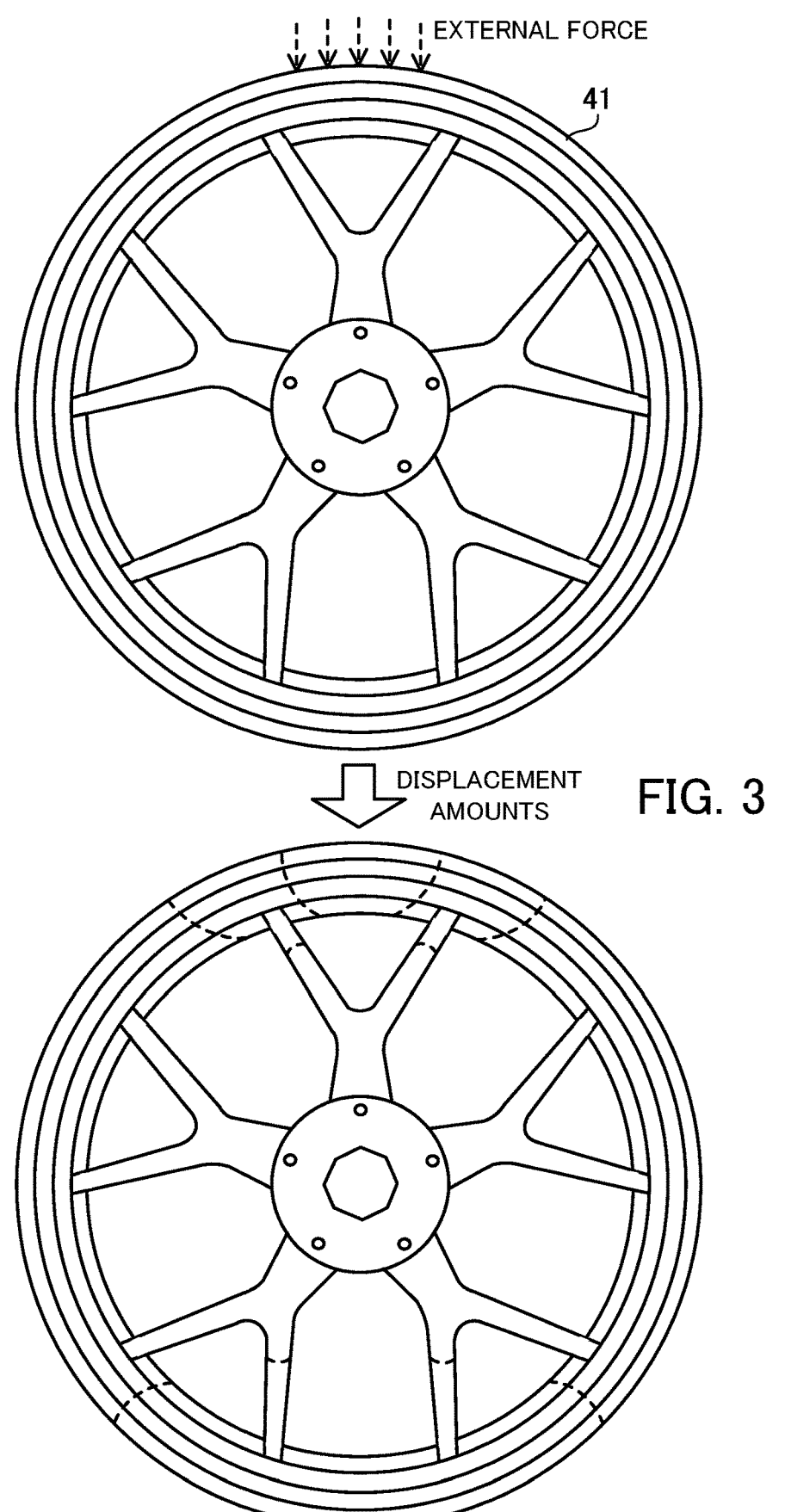
FIG. 3 illustrates an example of a simulation result of a wheel.

FIG. 3 illustrates an example of a simulation result of a wheel.

Mesh data 41 represents the shape of a wheel. Mesh generation software generates the mesh data 41 from CAD data that represents the shape of the wheel being designed. The mesh data 41 includes a plurality of nodes and a plurality of edges connecting the nodes. The mesh data 41 represents small areas into which the 3D space including the wheel has been divided. An individual small area has a triangular surface formed by three nodes and three edges.

In the present structural analysis simulation, the following boundary conditions are set for the mesh data 41. A certain magnitude of external force is applied to the top part of the wheel in a vertically downward direction. The bottom part of the wheel is a fixed point, which does not move. Thus, the wheel could deform when receiving external force from above. The wheel is made of single material.

In the structural analysis simulation, the displacement amounts of the individual nodes are calculated based on the mesh data 41 and the above boundary conditions. The shape of the deformed wheel is determined by a distribution of these displacement amounts. In the structural analysis simulation, visible data, with which the distribution of displacement amounts is visualized, may be outputted. Under the boundary conditions, generally, upper nodes exhibit larger displacement amounts, and lower nodes exhibit smaller displacement amounts. The user may repeat the structural analysis simulation on wheels having the same shape while changing parameters of the boundary conditions. Examples of these parameters of the boundary conditions include the strength of the force, the material, the force application range, and the fixed range.

The strength of the force is the magnitude of the external force applied to the top part of the wheel in the vertically downward direction. For example, 1, 10, 100, and 10000 may be set as the candidates of the strength of the force. The material is the kind of material of the wheel. For example, steel, copper, aluminum, cobalt, iron, magnesium, manganese, nickel, and titanium may be set as the candidates of the material. The force application range is the ratio of the height of the top part, to which the external force is applied, to the height of the wheel. For example, 1/4, 1/8, and 1/10 may be set as the candidates of the force application range. The fixed range is the ratio of the height of the bottom part, whose location does not change, to the height of the wheel. For example, 1/4, 1/8, and 1/10 may be set as the candidates of the fixed range.

Figure 4:
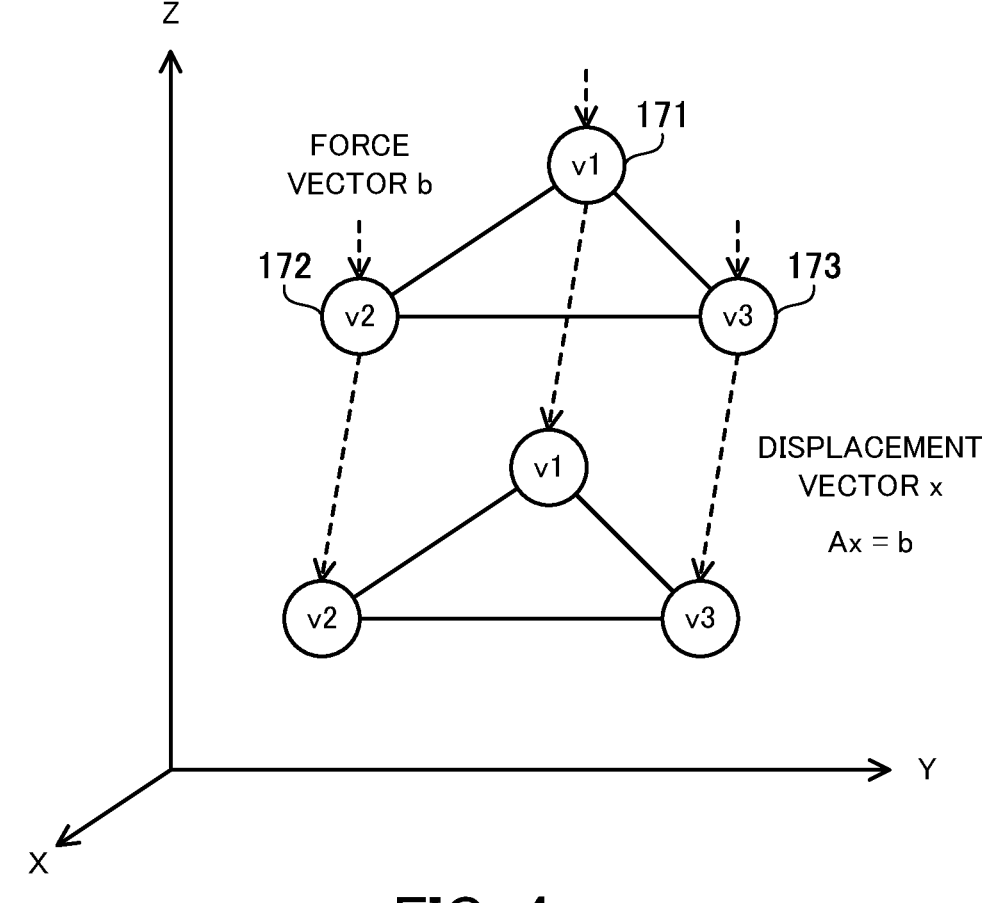
FIG. 4 illustrates an example of a simulation space of a finite element method.

FIG. 4 illustrates an example of a simulation space of a finite element method.

In a typical structural analysis simulation, the displacement amounts of the individual nodes of an object are calculated in accordance with a finite element method. In the structural analysis simulation, a variable representing a displacement amount is assigned to each of the plurality of nodes. A displacement vector x is obtained by listing the plurality of displacement amounts corresponding to the plurality of nodes. In addition, in the structural analysis simulation, a stiffness matrix A and a force vector b are calculated based on mesh data and boundary condition data.

The stiffness matrix A is obtained by dividing the stiffness of the object into small elements per location and discretely expressing the elements. The stiffness matrix A lists inter-node stiffness. The stiffness between two nodes is calculated from the coordinates of the two nodes, the material of the object, and governing equations representing physical laws. The stiffness depends on the length between the nodes, the cross-sectional area, and the elastic modulus. The governing equations include an equilibrium equation, a strain-displacement relation, and a stress-strain relation. The equilibrium equation indicates that zero is obtained when all force is synthesized. The strain-displacement relation indicates a relationship between strain and a displacement amount. The stress-strain relation indicates a relationship between stress and strain. The stiffness is calculated by solving these governing equations.

The force vector b lists a plurality of force values corresponding to the plurality of nodes. The force vector b may be referred to as a stress vector, an external force vector, or a load vector. The force applied to an individual node is calculated from the boundary conditions. The force applied to a node on an object surface in the force application range may be represented by a value specified by the boundary conditions. The force applied to a node outside the force application range or a node inside the object may be represented by zero. A relationship Ax=b is established among the stiffness matrix A, the force vector b, and the displacement vector x.

In the structural analysis simulation, the displacement vector x is calculated by solving the simultaneous linear equation Ax=b. A linear solver is used to solve the simultaneous linear equation. The linear solver calculates the displacement vector x as the solution by using an iterative method such as a conjugate gradient method. For example, the linear solver calculates the residual of b by assigning a temporary value to x and updates x based on the gradient in such that the residual is minimized. The linear solver repeats the updating of x until the residual converges.

For example, the mesh data includes nodes 171, 172, and 173 (nodes v1, v2, and v3). These nodes 171, 172, and 173 are connected to each other via edges. Thus, the mesh data includes the edge between the nodes 171 and 172, the edge between the nodes 172 and 173, and the edge between the nodes 171 and 173. The edges have no direction. Thus, the feature values of the edges have a symmetric property, and therefore, the stiffness matrix A is a symmetric matrix.

The nodes 171, 172, and 173 are located in a 3D space in an orthogonal coordinate system including the X axis, the Y axis, and the Z axis. The locations of the nodes 171, 172, and 173 are determined by their 3D coordinates. The nodes 171, 172, and 173 receive force along the Z axis. The force applied to the nodes 171, 172, and 173 is defined by the force vector b. Receiving this force, the nodes 171, 172, and 173 are shifted in their 3D space. How much the nodes 171, 172, and 173 are shifted is the displacement amounts. The displacement amounts of the nodes 171, 172, and 173 are expressed as the displacement vector x. The displacement amounts of the nodes 171, 172, and 173 could differ from each other. In addition, while the direction of the force is along the Z axis, the nodes 171, 172, and 173 could be shifted in the direction along the X axis or the Y axis.

As described above, in a typical structural analysis simulation, a linear solver calculates the displacement vector x by solving Ax=b. However, use of a linear solver to calculate a solution to a large-scale simultaneous equation could result in a large calculation amount and a long execution time. Therefore, instead of directly solving Ax=b, the information processing apparatus 100 uses a machine learning model to predict x.

FIG. 5 illustrates an example of displacement amount prediction based on a graph convolutional network.

In one method, a graph convolutional network (GCN) 31 is used for prediction of the displacement vector x. The graph convolutional network 31 is a multilayer neural network including at least one graph convolutional layer that performs a graph convolutional operation.

A general convolutional neural network (CNN) handles image data in which a plurality of pixels are arranged in a matrix. This convolutional neural network performs a convolutional operation on feature values of neighboring pixels. The adjacency relationship of a plurality of pixels is obvious from the arrangement of the pixels. In contrast, the graph convolutional network 31 handles graph data in which a plurality of nodes are connected to each other by edges. The graph convolutional network 31 performs a convolutional operation on feature values of neighboring nodes. The adjacency relationship of the plurality of nodes is not obvious but is explicitly defined by the graph data.

When the 3D space including an object is divided into a matrix of pixels, many empty pixels that do not express any part of the object are included in the matrix of pixels. Thus, since less input data is needed, the graph convolutional network 31 is more efficient than a general convolutional neural network.

The graph convolutional network 31 receives feature data 32. The feature data 32 is a feature matrix formed by n nodes and 9 dimensions (n×9). The feature vector of an individual node includes the coordinates, the force, the material density, the elastic modulus, and Poisson's ratio. The coordinates of an individual node are 3D coordinates indicating the location of this node in the orthogonal coordinate system. The force applied to an individual node is represented by a 3D vector indicating the direction and magnitude of the external force applied to this node. In the case of the example of the above wheel, the X component and the Y component of the force are zero. In addition, the force applied to an individual node within the fixed range and the force applied to an individual node inside the object are represented by zero vectors.

The material density, the elastic modulus, and Poisson's ratio are represented by one-dimensional scalar values. The coordinates of the individual nodes are extracted from the mesh data. The force, the material density, the elastic modulus, and Poisson's ratio are extracted from the boundary condition data. The graph convolutional network 31 calculates displacement data 33 from the mesh data and the feature data 32. The displacement data 33 is a displacement matrix formed by n nodes and 3 dimensions (n×3). The displacement data 33 corresponds to the displacement vector x. The displacement amount of an individual node is represented by a 3D vector indicating the direction and magnitude of shifting of this node in the orthogonal coordinate system.

The above feature data 32 includes feature values directly extracted from the mesh data and the boundary condition data, which is the input in a finite element method. The graph convolutional network 31 predicts the displacement amounts of the individual nodes from the feature data 32. However, the above graph convolutional network 31 could exhibit a low prediction accuracy.

Since the above boundary conditions are primitive parameters and do not express a physical law about the propagation of the force, the above boundary conditions have a low affinity with the displacement amounts. Thus, it is difficult to perform machine learning of the graph convolutional network 31 that suitably propagates information about the force between nodes and that accurately predicts the displacement amounts of the individual nodes. Thus, the information processing apparatus 100 according to the second embodiment defines the feature data entered to the graph convolutional network as follows.

Figure 6:
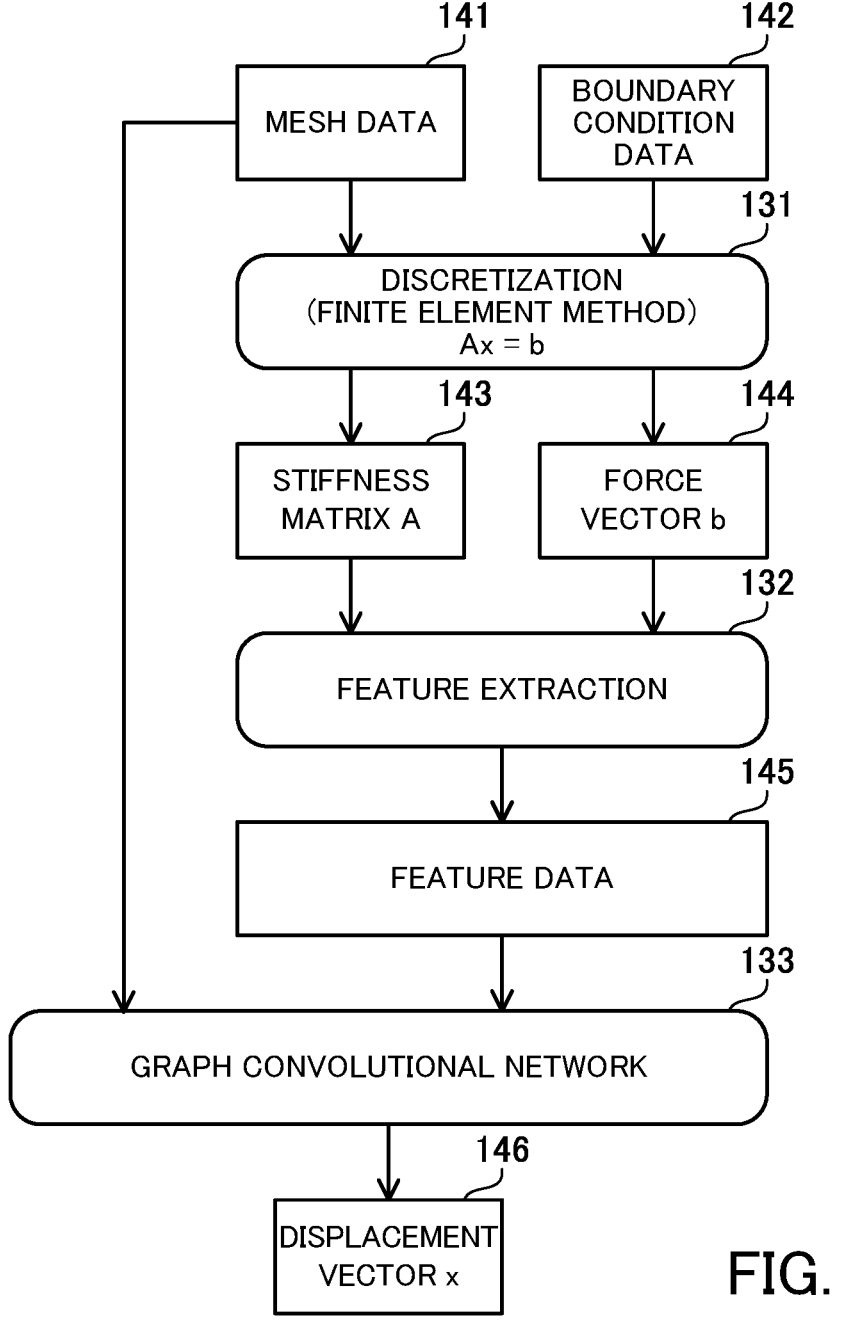
FIG. 6 illustrates a data flow example of displacement amount prediction according to the second embodiment.

FIG. 6 illustrates a data flow example of displacement amount prediction according to the second embodiment.

As in a general finite element method, the information processing apparatus 100 performs discretization 131 to calculate a stiffness matrix 143 (the stiffness matrix A) and a force vector 144 (the force vector b) from mesh data 141 and boundary condition data 142. In a general finite element method, a linear solver is used to calculate a displacement vector 146 (the displacement vector x) that satisfies Ax=b.

In contrast, instead of directly solving Ax=b with the linear solver, the information processing apparatus 100 performs feature extraction 132 to generate feature data 145 from the stiffness matrix 143 and the force vector 144. The feature data 145 includes the feature values extracted from the stiffness matrix 143 and the force vector 144. For example, the feature data 145 is a feature matrix in which the stiffness matrix 143 and the force vector 144 are coupled to each other.

The information processing apparatus 100 enters the mesh data 141 and the feature data 145 to a graph convolutional network 133. The graph convolutional network 133 includes at least one graph convolutional layer. The graph convolutional network 133 performs convolutional operations on the feature values included in the feature data 145 in accordance with an inter-node adjacency relationship indicated by the mesh data 141. In this way, the information processing apparatus 100 predicts the displacement vector 146.

As described above, while the information processing apparatus 100 performs the discretization 131 corresponding to the first half of the finite element method, the information processing apparatus 100 skips the part of the linear solver corresponding to the second half of the finite element method. In the finite element method, the calculation amount of the discretization 131 is relatively small, and the execution time is short. However, in the finite element method, the calculation amount of the linear solver is relatively large, and the execution time is long. The execution time of the feature extraction 132 and the execution time of the graph convolutional network 133 are sufficiently short. Thus, by skipping the part of the linear solver, the overall calculation amount of the structural analysis simulation is reduced, and the overall execution time is consequently shortened.

In addition, the feature values included in the stiffness matrix 143 and the force vector 144 reflect the physical law about the propagation of the force and have a high affinity with the displacement amounts. Thus, since suitable feature values are assigned to the individual nodes, it is possible to perform machine learning of the graph convolutional network 133 that accurately predicts the displacement amounts of the individual nodes. As a result, the prediction accuracy of the graph convolutional network 133 is improved.

In addition, since the boundary condition data 142 depends on the kind of object or phenomenon to be analyzed, the boundary condition data 142 has low versatility as information. For example, while the above feature data 32 includes the material density, the elastic modulus, and Poisson's ratio as parameters, in some cases it may be preferable to include other parameters, depending on the object or phenomenon to be analyzed. In contrast, in terms of the prediction of the displacement vector 146, the stiffness matrix 143 and the force vector 144 are generated as versatile data that does not depend on the boundary condition data 142. Thus, the versatility of the graph convolutional network 133 is improved.

Figure 7:
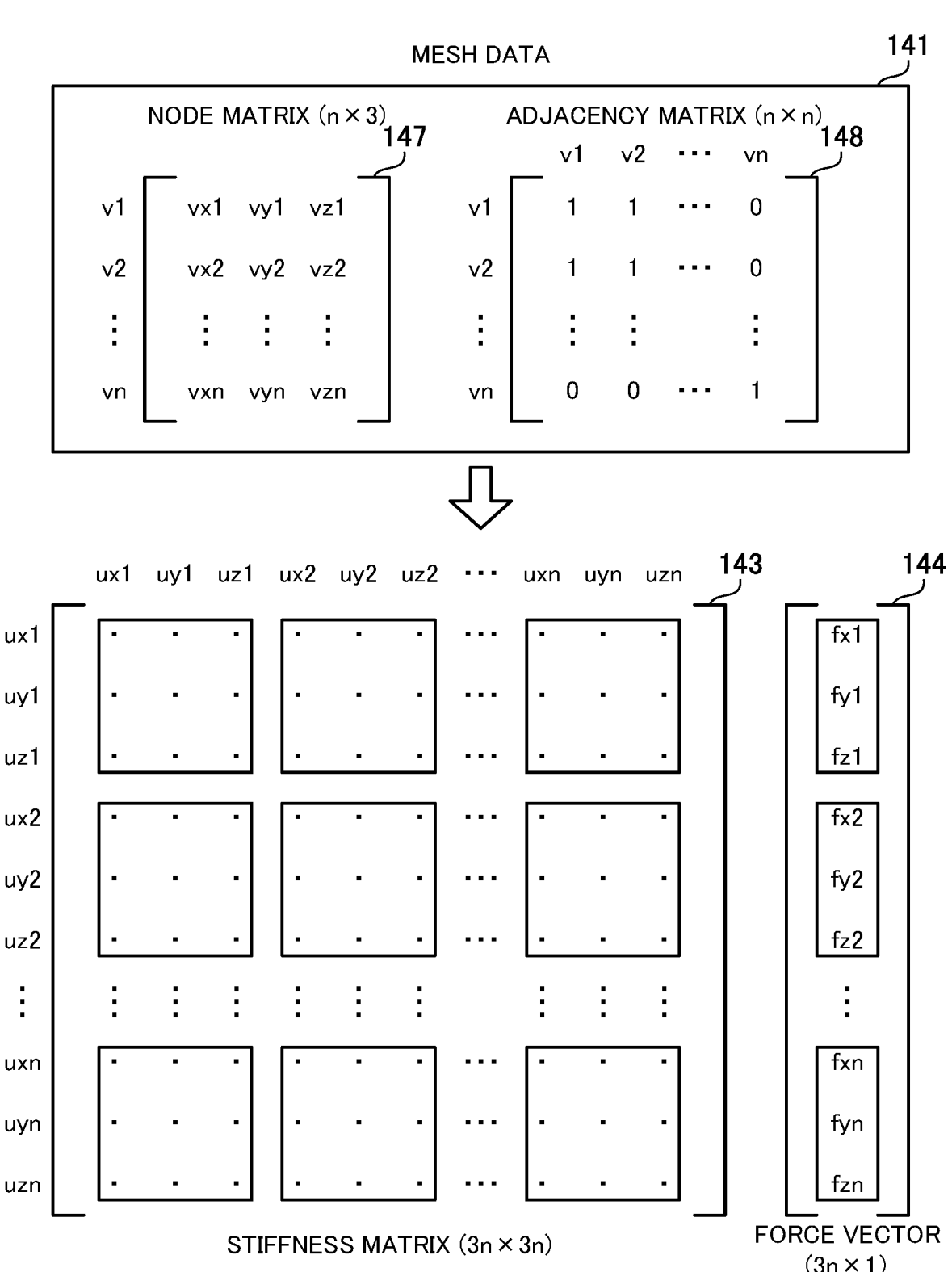
FIG. 7 illustrates structural examples of mesh data, a stiffness matrix, and a force vector.

FIG. 7 illustrates structural examples of the mesh data, the stiffness matrix, and the force vector.

The mesh data 141 includes a node matrix 147 and an adjacency matrix 148. The node matrix 147 is a matrix having a size of n×3. The n rows in the node matrix 147 correspond to n nodes. The three columns in the node matrix 147 correspond to the X coordinate, the Y coordinate, and the Z coordinate. Each row in the node matrix 147 represents the 3D coordinates of a single node.

The adjacency matrix 148 is a matrix having a size of n×n. The n rows in the node matrix 147 correspond to n nodes, and the n columns in the node matrix 147 correspond to n nodes. The intersection point of a row and a column represents a flag "0" or "1". "0" represents that there is no edge between the two nodes corresponding to the row and the column, and "1" represents that there is an edge between the two nodes corresponding to the row and the column. The adjacency matrix 148 is a symmetric matrix in which the value in an i-th row and a j-th column is the same as the value in the j-th row and the i-th column.

The information processing apparatus 100 generates the stiffness matrix 143 and the force vector 144 from the mesh data 141 and the boundary condition data 142. The stiffness matrix 143 is a matrix having a size of 3n×3n. A single block in the stiffness matrix 143 is formed by 3×3 consecutive elements. The three rows in a block correspond to the X direction, the Y direction, and the Z direction of a certain node. The three columns in the block correspond to the X direction, the Y direction, and the Z direction of the certain node. Thus, the 3n rows correspond to the X direction, the Y direction, and the Z direction of the n nodes. The 3n columns correspond to the X direction, the Y direction, and the Z direction of the n nodes.

Among the n×n blocks included in the stiffness matrix 143, diagonal blocks located on a diagonal line represent the stiffness in the same node. Non-diagonal blocks not located on a diagonal line represent the stiffness of the connection between different nodes. The individual block having a size of 3×3 includes the XX component, the XY component, the XZ component, the YX component, the YY component, the YZ component, the ZX component, the ZY component, and the ZZ component of the stiffness of a node.

The XX component of the stiffness of a node represents a relationship between the force in the X direction and the displacement in the X direction. The XY component represents a relationship between the force in the X direction and the displacement in the Y direction. The XZ component represents a relationship between the force in the X direction and the displacement in the Z direction. The YX component represents a relationship between the force in the Y direction and the displacement in the X direction. The YY component represents a relationship between the force in the Y direction and the displacement in the Y direction. The YZ component represents a relationship between the force in the Y direction and the displacement in the Z direction. The ZX component represents a relationship between the force in the Z direction and the displacement in the X direction. The ZY component represents a relationship between the force in the Z direction and the displacement in the Y direction. The ZZ component represents a relationship between the force in the Z direction and the displacement in the Z direction.

The n×n blocks in the stiffness matrix 143 form a symmetric matrix since the edges have no direction. In addition, the blocks corresponding to two nodes that are not adjacent to each other represent zero matrices. The stiffness matrix 143 is a sparse matrix having a smaller number of non-zero elements. In the second embodiment, since the structural analysis simulation is performed in a 3D space, the spatial degree of freedom is 3, and the individual block has a size of 3×3. If the structural analysis simulation is performed in a 2D space, the spatial degree of freedom is 2, and the individual block has a size of 2×2.

The force vector 144 is a vector having a size of 3n×1. Three consecutive elements in the force vector 144 form a single block. The three rows in a block represent the X component, the Y component, and the Z component of the force applied to a certain node. Thus, the 3n rows correspond to the X components, the Y components, and the Z components of the n nodes. If the structural analysis simulation is performed in a 2D space, the spatial degree of freedom is 2, and the individual block has a size of 2×1.

The values in diagonal blocks included in the stiffness matrix 143 may be considered as the feature values about a node. In addition, the values in non-diagonal blocks included in the stiffness matrix 143 may be considered as the feature values about an edge. In addition, the values in a block included in the force vector 144 may be considered as the feature values about a node. The information processing apparatus 100 uses the feature values about the nodes and the feature values about the edges.

Figure 8:
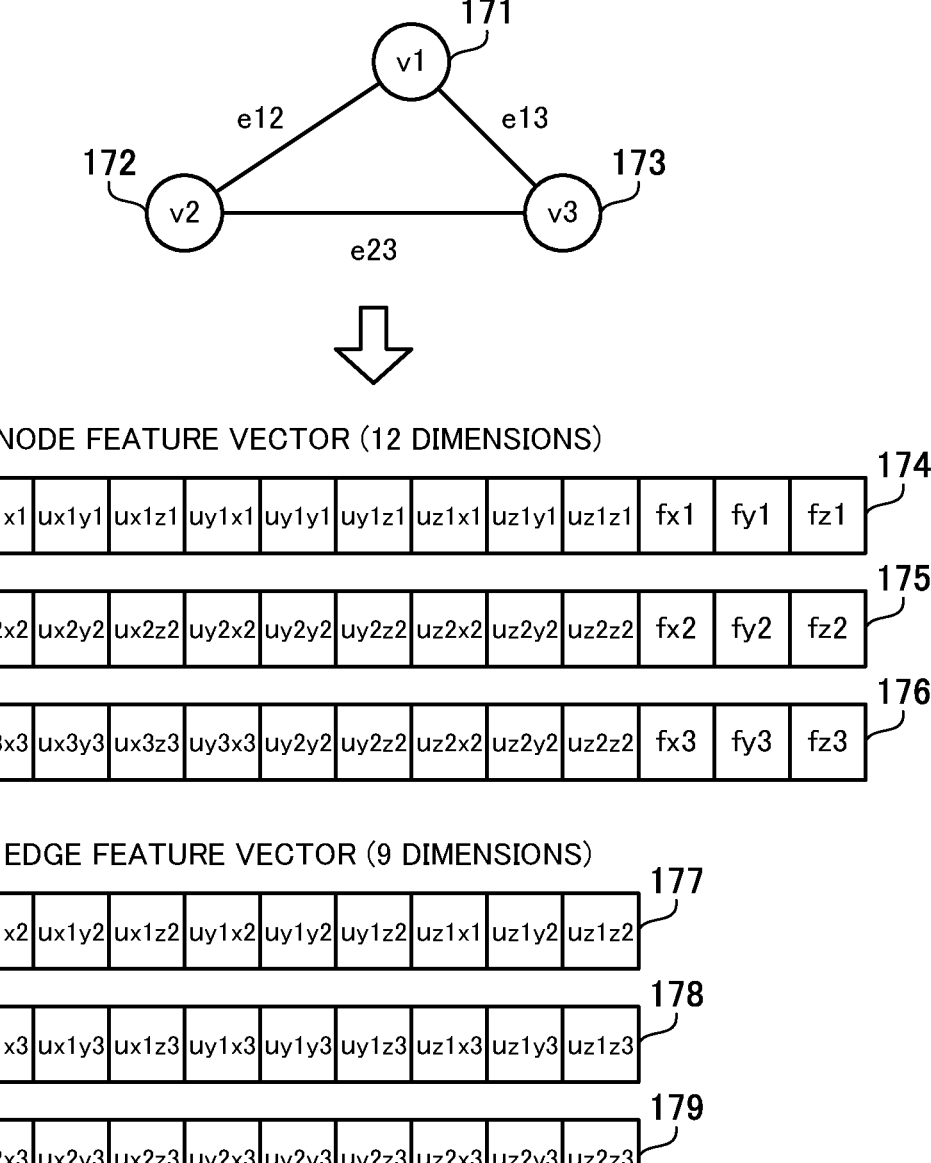
FIG. 8 illustrates structural examples of node feature vectors and edge feature vectors.

FIG. 8 illustrates structural examples of node feature vectors and edge feature vectors.

The following description will be made on the above nodes 171, 172, and 173. The nodes 171 and 172 are connected by an edge e12, the nodes 171 and 173 are connected by an edge e13, and the node 172 and 173 are connected by an edge e23.

A node feature vector 174 about the node 171, a node feature vector 175 about the node 172, and a node feature vector 176 about the node 173 are generated from the stiffness matrix 143 and the force vector 144. Each of the node feature vectors 174, 175, and 176 is a twelve-dimensional vector including twelve feature values. Nine of the twelve feature values are the values included in a diagonal block in the stiffness matrix 143. Three of the twelve feature values are the values in a block included in the force vector 144.

Thus, the node feature vector 174 includes the values included in the diagonal block corresponding to the node 171 in the stiffness matrix 143 and the values included in the block corresponding to the node 171 in the force vector 144. The node feature vector 175 includes the values included in the diagonal block corresponding to the node 172 in the stiffness matrix 143 and the values included in the block corresponding to the node 172 in the force vector 144. The node feature vector 176 includes the values included in the diagonal block corresponding to the node 173 in the stiffness matrix 143 and the values included in the block corresponding to the node 173 in the force vector 144.

In addition, an edge feature vector 177 about the edge e12, an edge feature vector 178 about the edge e13, and an edge feature vector 179 about the edge e23 are generated from the stiffness matrix 143 and the force vector 144. Each of the edge feature vectors 177, 178, and 179 is a nine-dimensional vector including nine feature values. These nine feature values are the values included in a non-diagonal block in the stiffness matrix 143.

Thus, the edge feature vector 177 includes the values included in the non-diagonal block corresponding to the nodes 171 and 172 in the stiffness matrix 143. The edge feature vector 178 includes the values included in the non-diagonal block corresponding to the nodes 171 and 173. The edge feature vector 179 includes the values included in the non-diagonal block corresponding to the nodes 172 and 173.

As described above, the information processing apparatus 100 extracts the feature values of the nodes and the feature values of the edges from the stiffness matrix 143 and the force vector 144. Note that the graph convolutional network 133 performs a convolutional operation on the feature vectors of neighboring nodes. Thus, the feature values of an edge are distributed to the feature vectors of the nodes relating to the edge. There may be some variations of the format of the feature data 145.

Figure 9:
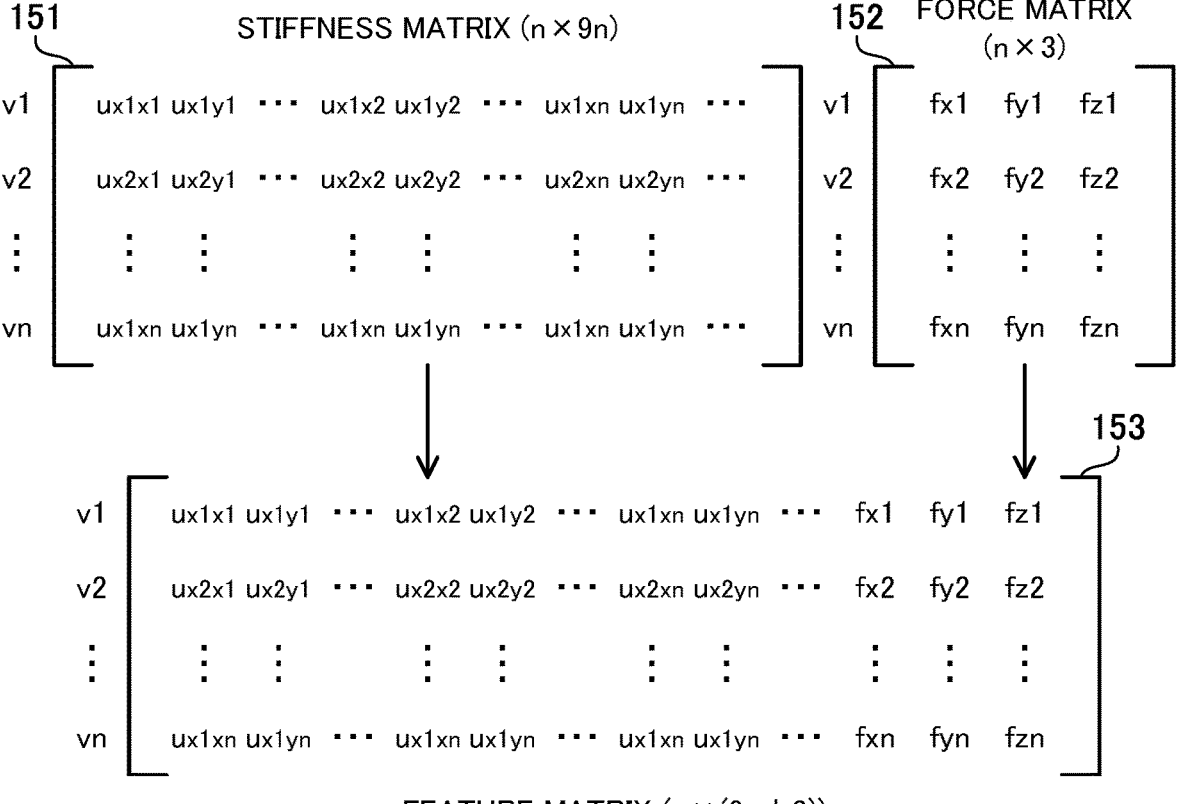
FIG. 9 illustrates an example of coupling of a stiffness matrix and a force matrix.

FIG. 9 illustrates an example of coupling of a stiffness matrix and a force matrix.

The information processing apparatus 100 converts the stiffness matrix 143 into a stiffness matrix 151. The stiffness matrix 151 is obtained by rearranging the 3n×3n elements included in the stiffness matrix 143 and is a matrix having a size of n×9n. The n rows in the stiffness matrix 151 correspond to n nodes. The 9n columns in the stiffness matrix 151 correspond to the elements in three consecutive rows in the stiffness matrix 143, that is, 3×3n elements. The individual block having a size of 3×3 is horizontally stretched to a size of 1×9.

In addition, the information processing apparatus 100 converts the force vector 144 into a force matrix 152. The force matrix 152 is obtained by rearranging the 3n×1 elements included in the force vector 144 and is a matrix having a size of n×3. The n rows in the force matrix 152 correspond to n nodes. The three columns in the force matrix 152 correspond to three consecutive elements in the force vector 144. The X component, the Y component, and the Z component of the force applied to an individual node are horizontally arranged.

The information processing apparatus 100 horizontally couples the stiffness matrix 151 and the force matrix 152, to generate a feature matrix 153. The feature matrix 153 corresponds to the feature data 145. The feature matrix 153 is a matrix having a size of n×(9n+3). A single row in the feature matrix 153 corresponds to the feature vector of a single node. Thus, the feature vector of a single node includes 9n+3 feature values. The feature vector of a single node includes nine feature values about the stiffness in this node, the 9(n−1) feature values about the stiffness between this node and the other nodes, and three feature values about the force applied to this node.

Among the n x n node pairs, only some of the node pairs are connected by an edge. That is, the stiffness matrix 143 is a sparse matrix. As a result, the feature matrix 153 is also a sparse matrix. Thus, the information processing apparatus 100 may remove the zero elements from the feature matrix 153 and left-align the non-zero elements. In this way, the number of columns of the feature matrix 153 is reduced. Alternatively, the feature vector of a certain node may include the feature values of edges located within a certain range from the certain node (for example, edges located within certain hops).

Figure 10:
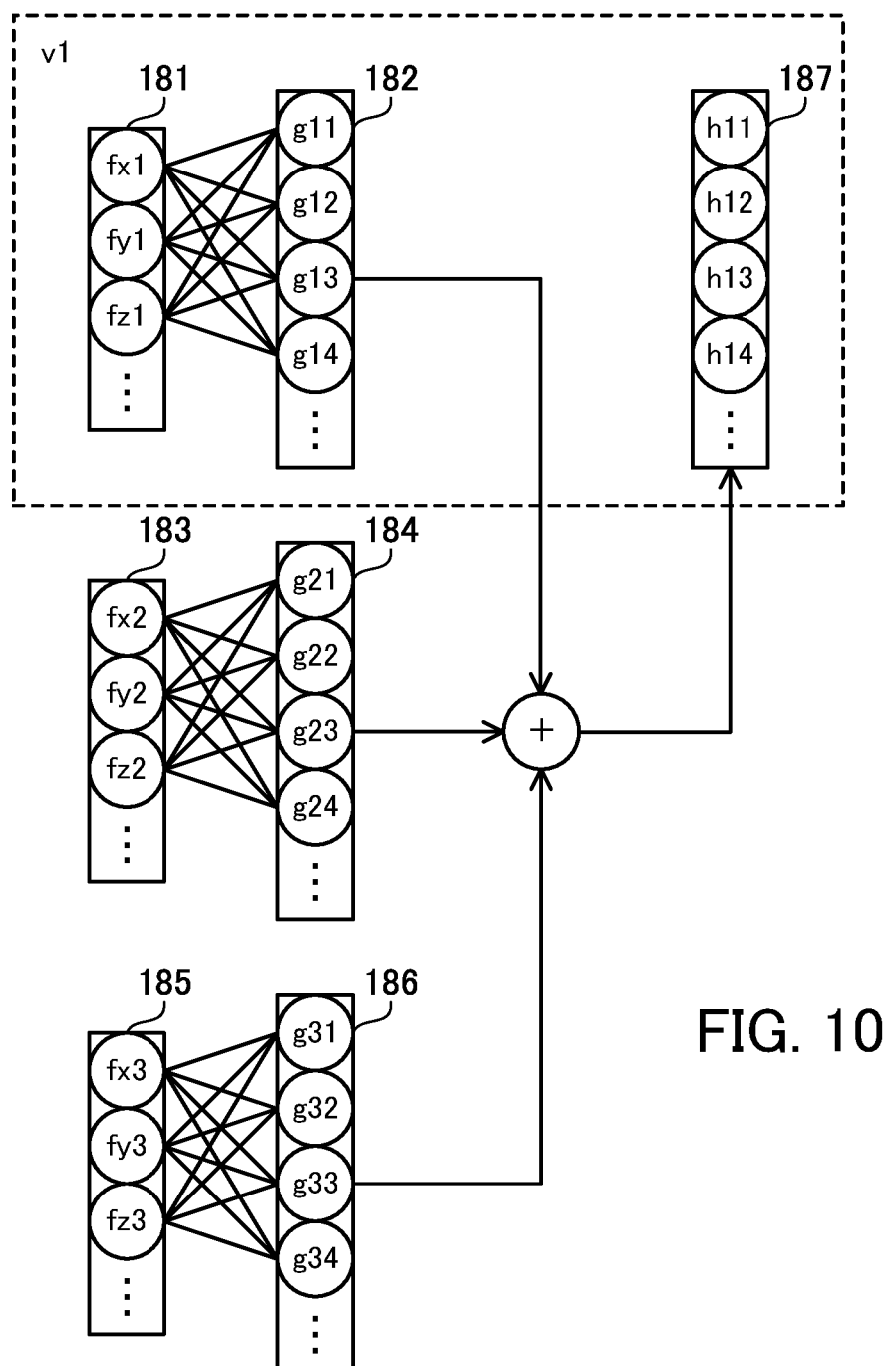
FIG. 10 illustrates an example of a graph convolutional operation.

FIG. 10 illustrates an example of a graph convolutional operation.

In accordance with the above method, a feature vector 181 corresponding to the node 171, a feature vector 183 corresponding to the node 172, and a feature vector 185 corresponding to the node 173 are generated. The graph convolutional network 133 performs a graph convolutional operation on the feature vectors 181, 183, and 185 in accordance with the adjacency relationship among the nodes 171, 172, and 173. Hereinafter, a procedure of updating the feature vector 181 of the node 171 will be described.

The graph convolutional network 133 applies a kernel to the feature vector 181 of the node 171, to generate a feature vector 182. The kernel is a group of coefficients indicating the weights of the feature values and is optimized through machine learning. The conversion from the feature vector 181 into the feature vector 182 may be expressed as a neural network. The number of feature values included in the feature vector 182 may be the same as, less than, or more than that in the feature vector 181. The number of feature values to be outputted is a hyper parameter specified by the user when machine learning is performed.

Likewise, the graph convolutional network 133 applies a kernel to the feature vector 183 of the node 172, to generate a feature vector 184. The graph convolutional network 133 applies a kernel to the feature vector 185 of the node 173, to generate a feature vector 186. The feature vectors 182, 184, and 186 include the same number of feature values. The same kernel or different kernels may be applied to the feature vectors 181, 183, and 185.

The graph convolutional network 133 adds the feature values of the feature vectors 182, 184, and 186, to generate a feature vector 187. The feature vector 187 is an updated feature vector of the node 171. In the same procedure, the graph convolutional network 133 updates the feature vectors 183 and 185 of the nodes 172 and 173. In a single graph convolutional layer, the feature vector of the individual node is updated once.

The graph convolutional operation is expressed by mathematical expression (1) where x represents a feature vector, i represents a target node, N(i) represents a group of neighboring nodes connected to node i by edges, k represents time, θ represents a kernel, and deg represents the number of neighboring nodes.

$$x_i^{(k)} = \sum_{j \in N(i) \cup \{i\}} \frac{1}{\sqrt{deg(i)}\sqrt{deg(j)}} \Theta \cdot x_j^{(k-1)} \qquad (1)$$

Figure 11:
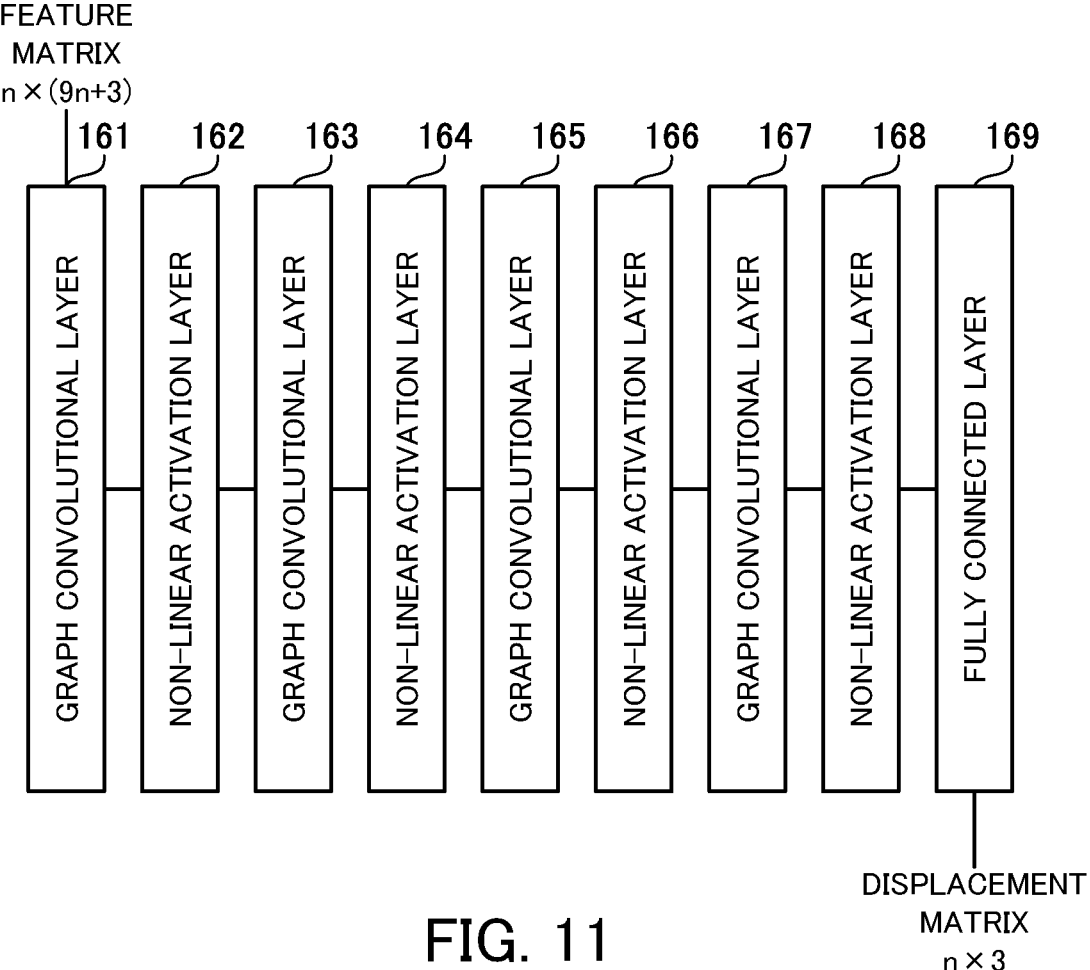
FIG. 11 illustrates an example of a graph convolutional network according to the second embodiment.

FIG. 11 illustrates an example of a graph convolutional network according to the second embodiment.

The graph convolutional network 133 includes four graph convolutional layers 161, 163, 165, and 167, four non-linear activation layers 162, 164, 166, and 168, and one fully connected layer 169. The four graph convolutional layers and the four non-linear activation layers are located alternately.

The graph convolutional layer 161 receives the feature matrix 153 having a size of n×(9n+3). The non-linear activation layer 162 is located after the graph convolutional layer 161. The graph convolutional layer 163 is located after the non-linear activation layer 162. The non-linear activation layer 164 is located after the graph convolutional layer 163. The graph convolutional layer 165 is located after the non-linear activation layer 164. The non-linear activation layer 166 is located after the graph convolutional layer 165. The graph convolutional layer 167 is located after the non-linear activation layer 166. The non-linear activation layer 168 is located after the graph convolutional layer 167. The fully connected layer 169 is located after the non-linear activation layer 168. The fully connected layer 169 outputs a displacement matrix having a size of n×3.

The graph convolutional layers 161, 163, 165, and 167 each perform a graph convolutional operation as described above on the feature vectors of the plurality of nodes. The non-linear activation layers 162, 164, 166, and 168 each convert the feature values by using a hyperbolic tangent function tanh. Another activation function such as a sigmoid function may alternatively be used. The fully connected layer 169 synthesizes a large number of feature values outputted by the non-linear activation layer 168, to calculate the 3n elements included in the displacement matrix. The number of graph convolutional layers is a hyper parameter and may be changed by the user when the machine learning is performed.

Figure 12:
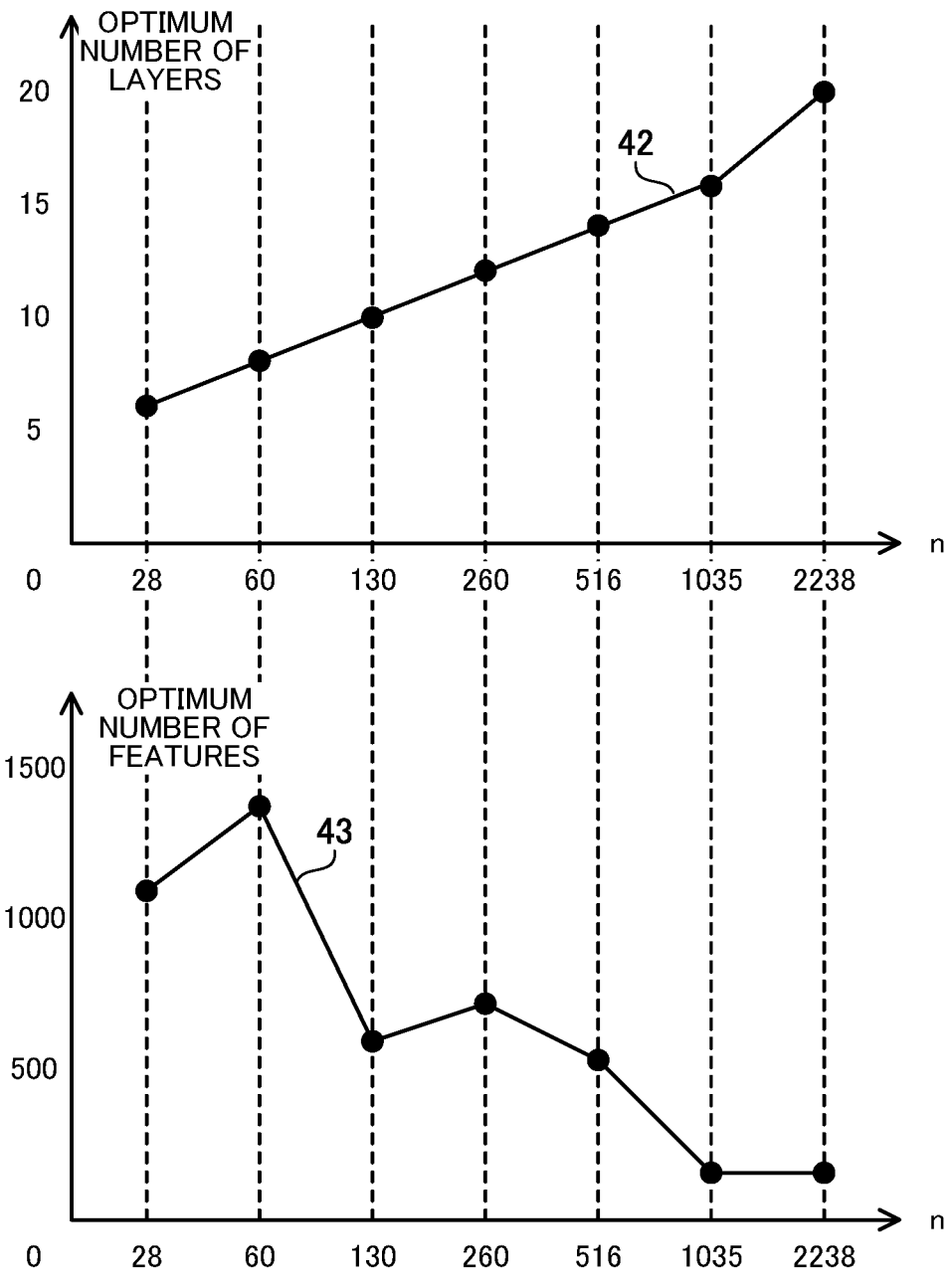
FIG. 12 is a graph illustrating examples of an optimum number of layers and an optimum number of features with respect to the number of nodes.

FIG. 12 is a graph illustrating examples of an optimum number of layers and an optimum number of features with respect to the number of nodes.

The information processing apparatus 100 is able to perform hyper parameter search to find the number of graph convolutional layers that achieves the highest prediction accuracy of the graph convolutional network 133 when machine learning is performed. The optimum number of graph convolutional layers depends on 'n' that indicates the number of nodes. A curve 42 indicates an example of a search result of an optimum number of graph convolutional layers.

When n=28, the optimum number is 6. When n=60, the optimum number is 8. When n=130, the optimum number is 10. When n=260, the optimum number is 12. When n=516, the optimum number is 14. When n=1035, the optimum number is 16. When n=2238, the optimum number is 20. In this way, when the mesh data includes more nodes, a better prediction accuracy could be achieved by using more graph convolutional layers. However, excessively increasing the number of graph convolutional layers does not result in improvement of the prediction accuracy. That is, there is an optimum number of graph convolutional layers.

In addition, the information processing apparatus 100 is also able to perform hyper parameter search to find the number of interlayer features that archives the highest prediction accuracy of the graph convolutional network 133 when machine learning is performed. The optimum number of features depends on the number n. A curve 43 indicates an example of a search result of an optimum number of features. As indicated by the curve 43, there are cases in which setting a smaller number of features in an intermediate layer results in a better prediction accuracy when the mesh data includes more node.

Figure 13:
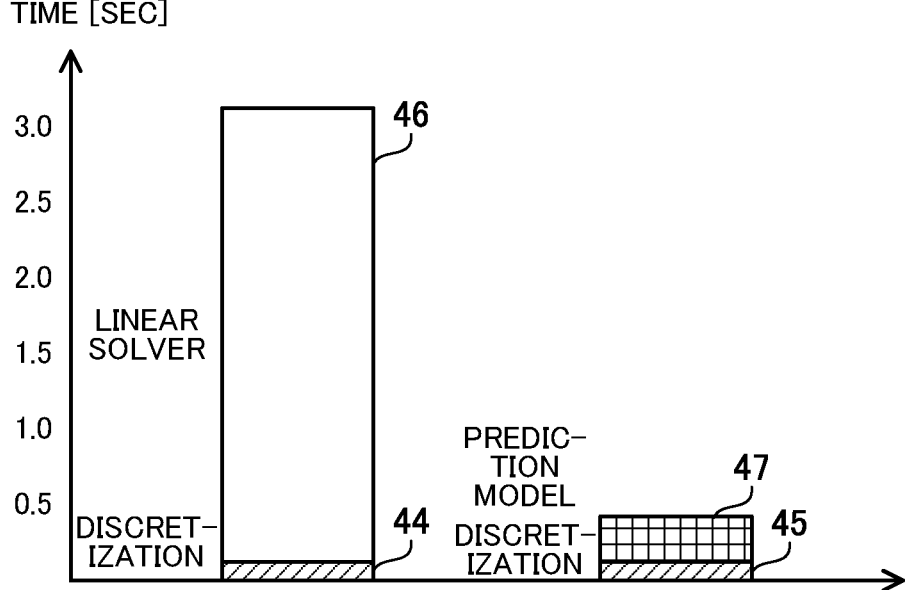
FIG. 13 is a graph illustrating an example of the execution time of a structural analysis simulation.

FIG. 13 is a graph illustrating an example of the execution time of a structural analysis simulation.

Execution times 44 and 45 are each a measured value of the execution time of the discretization 131. An execution time 46 is a measured value of the execution time of a linear solver. An execution time 47 is a measured value of the execution time of the prediction performed by the graph convolutional network 133. The total time of the execution times 44 and 46 corresponds to the execution time of a structural analysis simulation in a general finite element method. The total time of the execution times 45 and 47 corresponds to the execution time of a structural analysis simulation according to the second embodiment.

In the general finite element method, the execution time 46 of the linear solver is long, taking much of the overall execution time of the structural analysis simulation. In contrast, according to the second embodiment, the execution time 46 of the linear solver is replaced by the execution time 47 of the graph convolutional network 133. The execution time 47 of the graph convolutional network 133 is much shorter than the execution time 46 of the linear solver. Thus, the overall execution time of the structural analysis simulation is significantly shortened.

Figure 14:
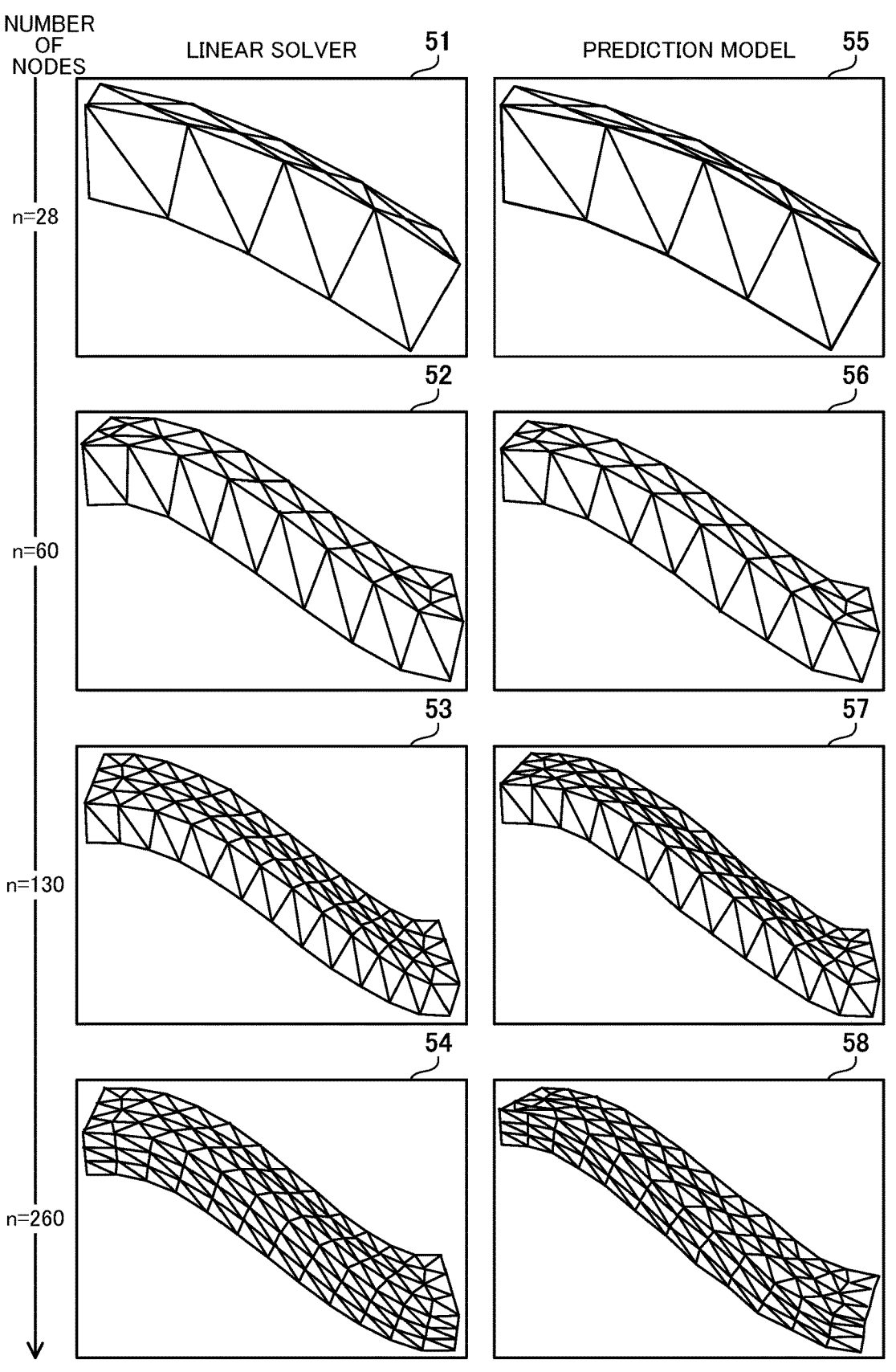
FIG. 14 illustrates an example of a simulation result of a cantilever.

FIG. 14 illustrates an example of a simulation result of a cantilever.

Hereinafter, an example of prediction of the displacement amounts of a different object will be described. Analysis results 51 to 58 each indicate a shape of a cantilever deformed by application of a certain amount of force to a right end portion of the cantilever. The analysis result 51 is an example in which the displacement vector is calculated by a linear solver from 28 nodes included in mesh data (n=28). The analysis result 52 is an example in which the displacement vector is calculated by the linear solver from 60 nodes included in the mesh data (n=60). The analysis result 53 is an example in which the displacement vector is calculated by the linear solver from 130 nodes included in the mesh data (n=130). The analysis result 54 is an example in which the displacement vector is calculated by the linear solver from 260 nodes included in the mesh data (n=260).

The analysis result 55 is an example in which the displacement vector is predicted by the graph convolutional network 133 from 28 nodes included in mesh data (n=28). The analysis result 56 is an example in which the displacement vector is predicted by the graph convolutional network 133 from 60 nodes included in the mesh data (n=60). The analysis result 57 is an example in which the displacement vector is predicted by the graph convolutional network 133 from 130 nodes included in the mesh data (n=130). The analysis result 58 is an example in which the displacement vector is predicted by the graph convolutional network 133 from 260 nodes included in the mesh data (n=260).

The graph convolutional network 133 accurately predicts the displacement vectors calculated by the linear solver. In particular, the graph convolutional network 133 predicts a more accurate displacement vector when the mesh data includes a smaller number of nodes.

Next, functions and processing procedures of the information processing apparatus 100 will be described.

Figure 15:
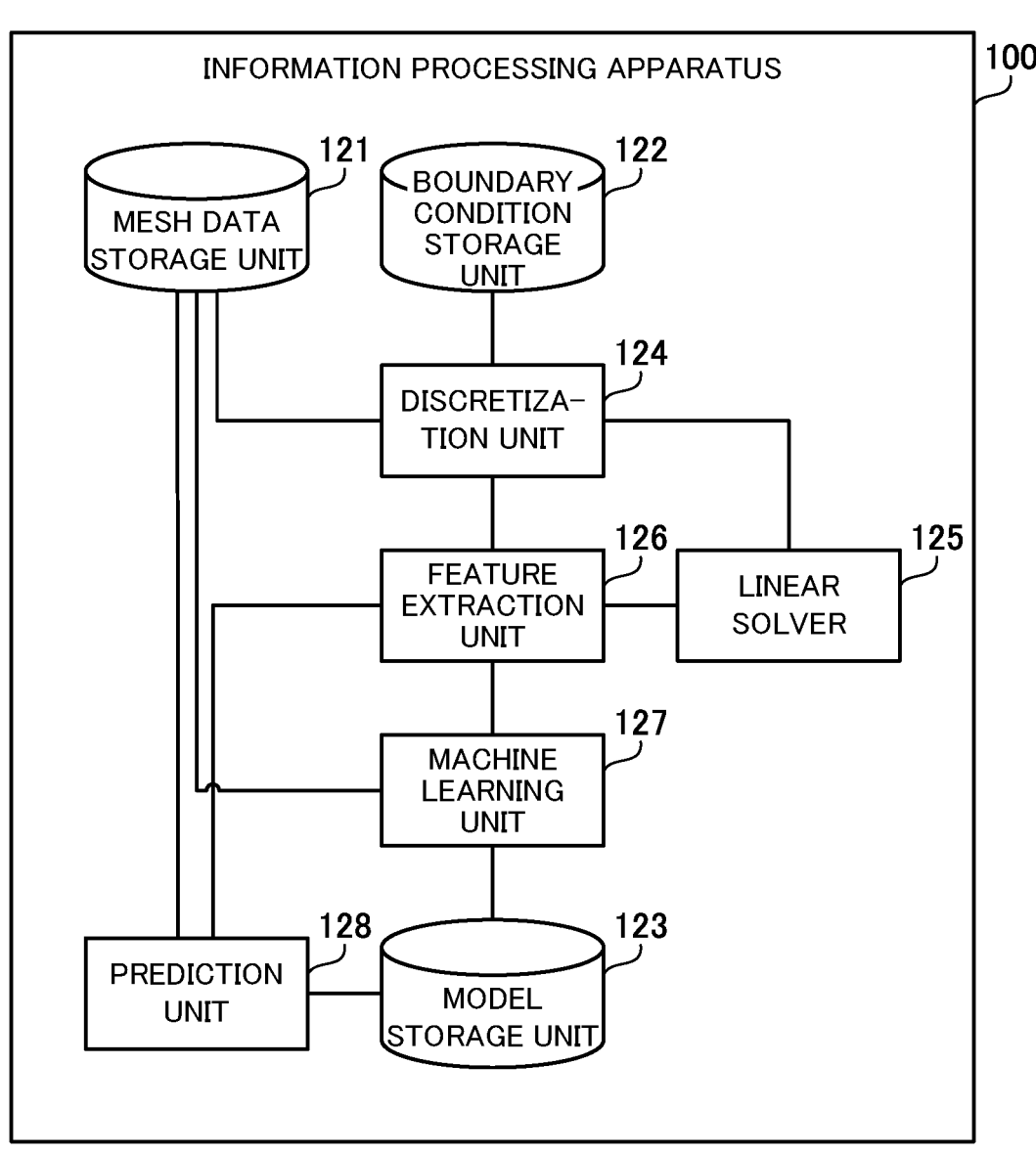
FIG. 15 is a block diagram illustrating a functional example of the information processing apparatus.

FIG. 15 is a block diagram illustrating a functional example of the information processing apparatus.

The information processing apparatus 100 includes a mesh data storage unit 121, a boundary condition storage unit 122, and a model storage unit 123. These storage units are each implemented by using the RAM 102 or the HDD 103, for example. In addition, the information processing apparatus 100 includes a discretization unit 124, a linear solver 125, a feature extraction unit 126, a machine learning unit 127, and a prediction unit 128. These processing units are each implemented by using the CPU 101 and a program, for example.

The mesh data storage unit 121 stores mesh data used for machine learning of the graph convolutional network. The mesh data storage unit 121 may store a plurality of kinds of mesh data that represent different shapes of the same kind of object for the machine learning. The mesh data storage unit 121 stores mesh data that represents the shape of an analysis target object.

The boundary condition storage unit 122 stores boundary condition data used for the machine learning of the graph convolutional network 133. The boundary condition storage unit 122 may store a plurality of kinds of boundary condition data, each of which represents external force being applied to an object in a different way and a different object material. The model storage unit 123 stores the graph convolutional network 133 generated by the machine learning.

The discretization unit 124 reads mesh data from the mesh data storage unit 121 and reads boundary condition data from the boundary condition storage unit 122. The discretization unit 124 calculates a stiffness matrix and a force vector from the mesh data, the boundary condition data, and governing equations. When the machine learning is performed, the discretization unit 124 calculates a plurality of stiffness matrices and a plurality of force vectors as a plurality of sets. When the displacement amounts are predicted, the discretization unit 124 calculates a stiffness matrix and a force vector for the analysis target.

When the machine learning is performed, the linear solver 125 acquires the stiffness matrix and the force vector from the discretization unit 124. The linear solver 125 calculates a displacement vector by solving Ax=b in accordance with an iterative method such as a conjugate gradient method. This displacement vector is a correct displacement vector based on the given stiffness matrix and force vector and corresponds to teaching data. This correct displacement vector may be derived differently from solving Ax=b. The linear solver 125 calculates a plurality of displacement vectors from the plurality of stiffness matrix and the plurality of force vectors as the plurality of sets.

The feature extraction unit 126 acquires a stiffness matrix and a force vector from the discretization unit 124. The feature extraction unit 126 synthesizes the stiffness matrix and the force vector, to generate a feature matrix. For example, the feature extraction unit 126 first rearranges each of the stiffness matrix and the force vector such that each row corresponds to one node and next horizontally couples the stiffness matrix and the force vector.

This feature matrix corresponds to the input data of the graph convolutional network. When the machine learning is performed, the feature extraction unit 126 acquires the displacement vector from the linear solver 125 and combines the feature matrix corresponding to the input data and the displacement vector corresponding to the teaching data. The feature extraction unit 126 generates training data including a plurality of feature matrices and a plurality of displacement vectors as a plurality of sets. When the displacement amounts are predicted, the feature extraction unit 126 outputs the feature matrix of the analysis target.

The machine learning unit 127 acquires a feature matrix and a displacement vector from the feature extraction unit 126 and reads mesh data from the mesh data storage unit 121. The machine learning unit 127 optimizes a graph convolutional network in accordance with an optimization algorithm such as backpropagation. For example, the machine learning unit 127 performs graph convolutional operations based on the feature matrix and the mesh data, predicts a displacement vector, and evaluates an error from the teaching data. The machine learning unit 127 updates the parameters of the graph convolutional layers such that the error is minimized. The machine learning unit 127 stores the generated graph convolutional network in the model storage unit 123.

The prediction unit 128 reads the graph convolutional network from the model storage unit 123, reads the mesh data of the analysis target from the mesh data storage unit 121, and acquires the feature matrix of the analysis target from the feature extraction unit 126. The prediction unit 128 enters the feature matrix and the mesh data to the graph convolutional network, to predict a displacement vector. The prediction unit 128 outputs the predicted displacement vector. The prediction unit 128 may store the displacement vector in the HDD 103, display the displacement vector on the display device 111, or transmit the displacement vector to a different information processing apparatus.

Figure 16:
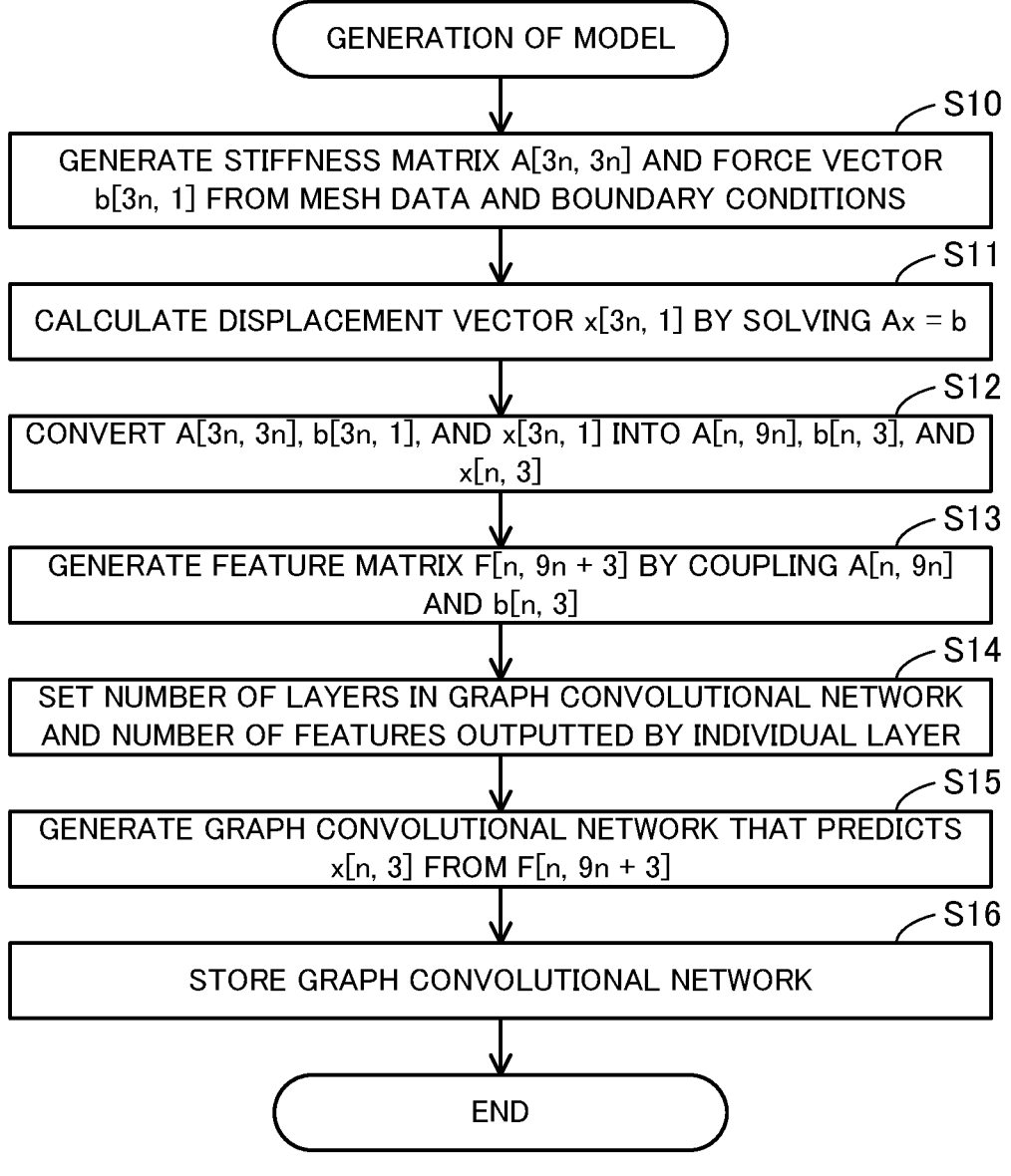
FIG. 16 is a flowchart illustrating an example of a model generation procedure according to the second embodiment.

FIG. 16 is a flowchart illustrating an example of a model generation procedure according to the second embodiment.

(S10) The discretization unit 124 generates a 3n×3n stiffness matrix A and a 3n×1 force vector b from mesh data and boundary condition data.

(S11) The linear solver 125 calculates a 3n×1 displacement vector x by solving a simultaneous linear equation Ax=b from A and b generated in step S10 in accordance with an iterative method.

(S12) The feature extraction unit 126 converts the 3n×3n stiffness matrix A into an n×9n stiffness matrix A by rearranging the elements in the 3n×3n stiffness matrix A. In addition, the feature extraction unit 126 converts the 3n×1 force vector b into an n×3 force matrix b by rearranging the elements in the 3n×1 force vector b. In addition, the feature extraction unit 126 converts the 3n×1 displacement vector x into an n×3 displacement matrix x by rearranging the elements in the 3n×1 displacement vector x. As a result, each row in the stiffness matrix A corresponds to a single node, each row in the force matrix b corresponds to a single node, and each row in the displacement matrix x corresponds to a single node.

(S13) The feature extraction unit 126 generates an n×(9n+3) feature matrix F by horizontally coupling the n×9n stiffness matrix A and the n×3 force matrix b. The feature extraction unit 126 generates training data by combining the feature matrix F and the displacement matrix x.

(S14) The machine learning unit 127 sets the number of graph convolutional layers included in a graph convolutional network and the number of feature values outputted by the individual graph convolutional layer. The number of layers and the number of features may be specified by the user. Alternatively, the machine learning unit 127 may perform hyper parameter search to optimize the number of layers and the number of features.

(S15) The machine learning unit 127 generates a graph convolutional network that predicts an n×3 displacement matrix x from the n×(9n+3) feature matrix F by using the training data generated in step S13. Herein, a kernel used in the individual graph convolutional layer is optimized.

(S16) The machine learning unit 127 stores the generated graph convolutional network.

Figure 17:
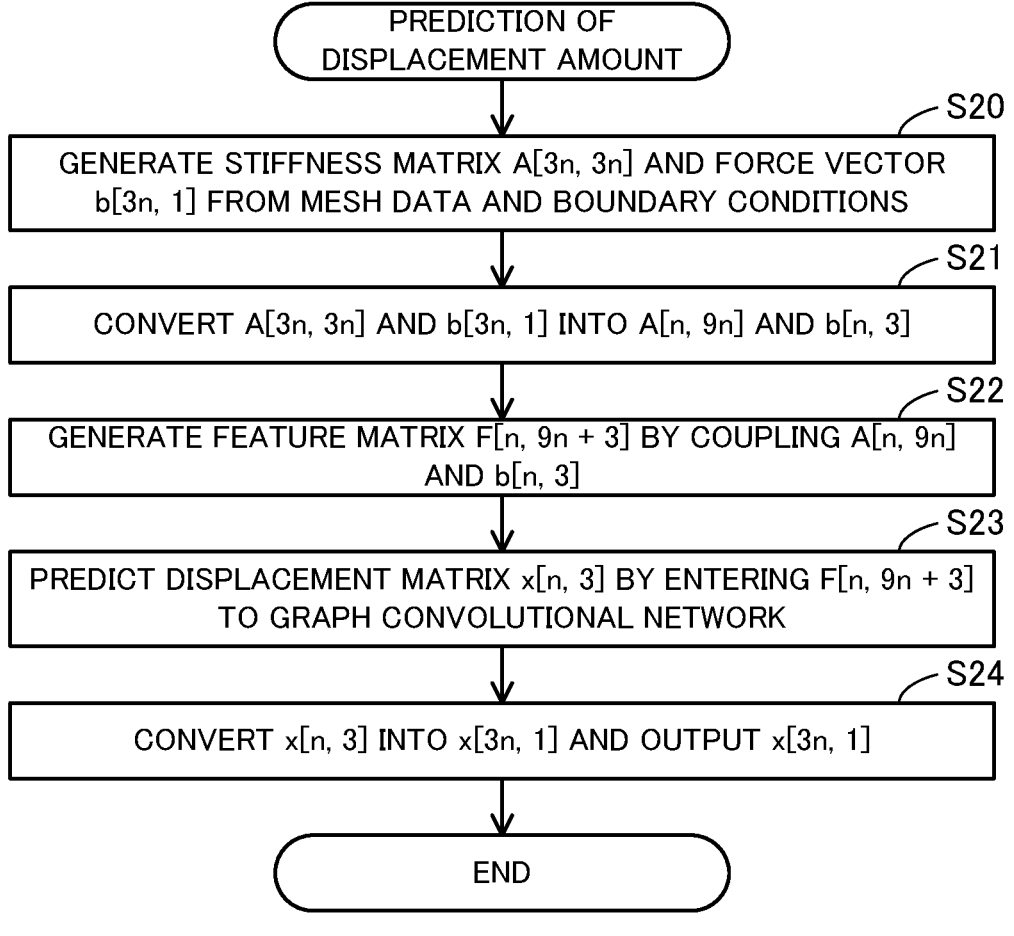
FIG. 17 is a flowchart illustrating an example of a displacement amount prediction procedure according to the second embodiment.

FIG. 17 is a flowchart illustrating an example of a displacement amount prediction procedure according to the second embodiment.

(S20) The discretization unit 124 generates a 3n×3n stiffness matrix A and a 3n×1 force vector b from mesh data and boundary condition data.

(S21) The feature extraction unit 126 converts the 3n×3n stiffness matrix A into an n×9n stiffness matrix A by rearranging the elements in the 3n×3n stiffness matrix A. In addition, the feature extraction unit 126 converts the 3n×1 force vector b into an n×3 force matrix b by rearranging the elements in the 3n×1 force vector b.

(S22) The feature extraction unit 126 generates an n×(9n+3) feature matrix F by horizontally coupling the n×9n stiffness matrix A and the n×3 force matrix b.

(S23) The prediction unit 128 predicts the n×3 displacement matrix x by entering an n×(9n+3) feature matrix F to the graph convolutional network.

(S24) The prediction unit 128 converts the n×3 displacement matrix x into a 3n×1 displacement vector x by rearranging the elements in the n×3 displacement matrix x. The prediction unit 128 outputs the displacement vector x.

As described above, the information processing apparatus 100 according to the second embodiment performs a structural analysis simulation that calculates the displacement amounts of the individual nodes from mesh data and boundary condition data. In this way, the information processing apparatus 100 is able to provide information useful in designing object shapes. In addition, instead of calculating a displacement vector x by solving Ax=b with a linear solver, the information processing apparatus 100 predicts the displacement vector x from a feature matrix. In this way, the calculation amount of the structural analysis simulation is reduced, and the execution time is consequently shortened.

In addition, the information processing apparatus 100 enters the feature matrix to a graph convolutional network and predicts the displacement vector x through graph convolutional operations. In this way, compared with a general convolutional neural network that handles image data in which pixels are arranged in a matrix, the number of empty pixels is less, and the input data is made more compact. In addition, in accordance with the adjacency relationship among the nodes, the convolutional operations are efficiently performed on the feature values of the nodes, and the information about the force is efficiently propagated.

In addition, the information processing apparatus 100 generates a feature matrix from a stiffness matrix A and a force vector b. In this way, the individual nodes are assigned suitable feature values on which the physical law about the propagation of the force is reflected, and the prediction accuracy of the displacement vector x is consequently improved. In addition, in the structural analysis simulation, the stiffness matrix A and the force vector b are versatile data that does not depend on the items of the boundary condition data. Thus, since the feature matrix also has a versatile structure, the versatility of the graph convolutional network is improved. That is, the graph convolutional network is applicable to various structural analyses.

Third Embodiment

Next, a third embodiment will be described. The third embodiment will be described with a focus on the difference from the second embodiment. The description of the same contents between the second embodiment and the third embodiment may be omitted, as needed. An information processing apparatus according to the third embodiment may be achieved by the same hardware configuration and software configuration as those illustrated in FIGS. 2 and 15. Thus, the third embodiment will be described by using the same reference characters in FIGS. 2 and 15.

The feature matrix entered to the graph convolutional network according to the second embodiment has a size of n×(9n+3) based on the number n. Thus, 9n+3 feature values are given to each node. However, since the stiffness corresponding to those node pairs that are not connected by any edges is zero, this feature matrix is a sparse matrix including many zero elements. For example, in some cases, about 70% of the feature values included in the feature matrix represents zero. Thus, the third embodiment attempts to compress the size of the feature matrix.

As described above, the information processing apparatus 100 may reduce the number of columns in the feature matrix by removing the zero elements from the feature matrix and left-aligning the non-zero elements. However, if the zero elements are simply removed from the feature matrix, different feature values of associated nodes are mixed and used in the graph convolutional operations, possibly increasing the information loss and needing more time for the feature values to suitably propagate among the nodes. As a result, the prediction accuracy of the graph convolutional network could deteriorate.

This deterioration of the prediction accuracy could be mitigated by increasing the number of graph convolutional layers. However, as discussed in the second embodiment, even if the number of graph convolutional layers is increased, there is a limit to improvement of the prediction accuracy. That is, even if the number of graph convolutional layers is increased excessively, the prediction accuracy will not improve proportionally. In addition, if the mesh data includes more node, the prediction accuracy deteriorates more easily. Thus, according to the third embodiment, the number of dimensions of the feature vector of the individual node is reduced by performing principal component analysis.

Figure 18:
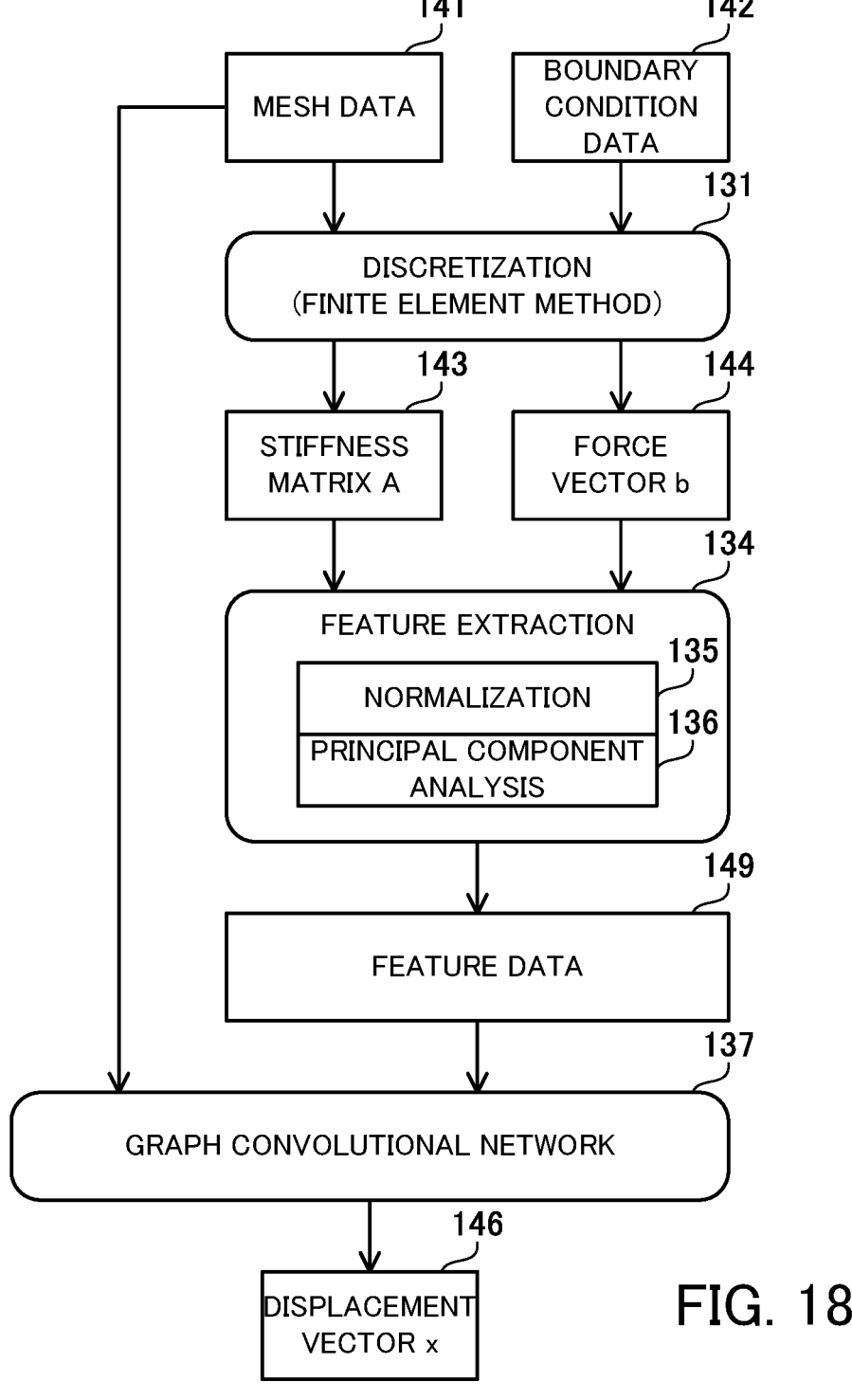
FIG. 18 illustrates a data flow example of displacement amount prediction according to a third embodiment.

FIG. 18 illustrates a data flow example of displacement amount prediction according to a third embodiment.

As in the second embodiment, an information processing apparatus 100 according to a third embodiment calculates a stiffness matrix 143 and a force vector 144 from mesh data 141 and boundary condition data 142 by performing discretization 131. The information processing apparatus 100 generates feature data 149 from the calculated stiffness matrix 143 and force vector 144 by performing feature extraction 134. Next, the information processing apparatus 100 enters the mesh data 141 and the feature data 149 to a graph convolutional network 137, to predict the displacement vector 146.

The feature data 149 is a feature matrix having a smaller number of feature values than the feature data 145 according to the second embodiment. The number of feature values of the individual node, that is, the number of columns in the feature matrix of the feature data 149 is less than that of the feature data 145. To generate the feature data 149, the feature extraction 134 includes normalization 135 and principal component analysis 136.

As in the second embodiment, the feature extraction 134 converts the stiffness matrix 143 into an n×9n stiffness matrix such that each row corresponds to a single node. In addition, the feature extraction 134 converts the force vector 144 into an n×3 force matrix such that each row corresponds to a single node. Next, the feature extraction 134 couples the resultant stiffness matrix and force matrix, to generate an n×(9n+3) feature matrix. The feature extraction 134 performs the normalization 135 and the principal component analysis 136 on this feature matrix.

The normalization 135 performs scale conversion to convert the individual feature value included in the feature matrix into a value between −1 and 1, inclusive. The normalization 135 is performed on each column (dimension) in the feature matrix. The normalization 135 is a maximum absolute scaler. Through this normalization 135, a feature value having the maximum absolute value is converted into 1 or −1, and a feature value originally having 0 is maintained as 0. The normalization 135 extracts a feature value having the maximum absolute value from a single column. If the feature value is positive, the normalization 135 determines a conversion scaling factor such that the feature value represents 1. If the feature value is negative, the normalization 135 determines a conversion scaling factor such that the feature value represents −1.

The principal component analysis 136 performs principal component analysis processing on the normalized feature matrix, to reduce the number of columns in the feature matrix. As a result, the number of feature values of the individual node is reduced, and the length (dimension number) of the feature vector given to the node is reduced. The principal component analysis 136 calculates a basis of an eigenvector such that an eigenvalue of a covariance is maximized.

For example, the principal component analysis 136 is performed as follows. The principal component analysis 136 calculates a covariance matrix $\Sigma=(1/m)X^*\times X$ for a certain matrix X. The principal component analysis 136 performs singular value decomposition (SVD) to decompose the covariance matrix $\Sigma$, as expressed by $\Sigma=USV$ in which U is a left singular matrix, S is a singular value matrix, and V is a right singular matrix. The principal component analysis 136 extracts, from the left singular matrix U, as many columns as the number of post-compression dimensions, and generates a matrix Ur in which only the extracted columns are arranged. The principal component analysis

136 calculates a matrix Z ($Z=Ur\times X$). This matrix Z is a matrix obtained as a result of the conversion from the matrix X by the principal component analysis 136.

The number of post-compression dimensions may be a fixed value, may be specified by the user, or may be determined based on the number of nodes. For example, the principal component analysis 136 adjusts the number of post-compression dimensions such that the variance of the post-conversion feature matrix is 95% of that of the pre-conversion feature matrix. If a smaller number of post-compression dimensions is used, a smaller data amount is needed. However, in this case, the variance becomes small, resulting in information loss. In contrast, if a larger number of post-compression dimensions is used, the variance becomes larger, and the information loss becomes less. However, in this case, a larger data amount is needed.

The structure of the graph convolutional network 137 is similar to that of the graph convolutional network 133 according to the second embodiment. However, the size of the input data differs from that of the graph convolutional network 133. In addition, as will be described below, the graph convolutional network 137 includes fewer graph convolutional layers than those in the graph convolutional network 133.

FIG. 19 illustrates an example of normalization and principal component analysis performed on a feature matrix.

The following description will be made on a case in which the mesh data 141 includes 28 nodes. A feature matrix 154 is generated by coupling the stiffness matrix 143 and the force vector 144. The feature matrix 154 is a matrix formed by 28 rows×255 columns. The feature matrix 154 is converted into a feature matrix 155 by the normalization 135. The feature matrix 155 is formed by 28 rows×255 columns. The individual feature value in the feature matrix 155 is normalized to a value between −1 and 1, inclusive. Next, the feature matrix 155 is converted into a feature matrix 156 by the principal component analysis 136.

In FIG. 19, the number of post-compression dimensions is set to 20. Thus, the feature matrix 156 is formed by 28 rows×20 columns. In this way, the length of the feature vector of the individual node is reduced from 255 to 20. In addition, since the principal component analysis 136 takes the whole feature matrix 155 into consideration, less information loss occurs compared with the method in which the zero elements are removed from the feature matrix 154. In addition, the feature value of one node reflects, to some extent, the feature value of another node that is away from the one node.

Figure 20:
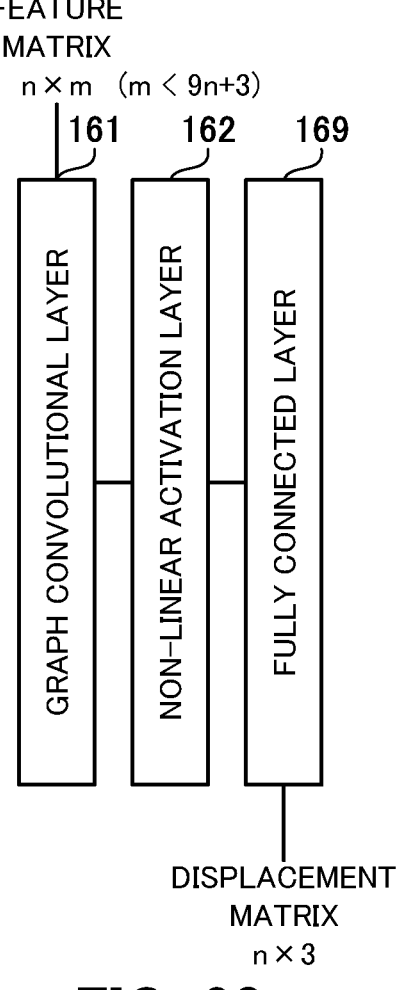
FIG. 20 illustrates an example of a graph convolutional network according to the third embodiment.

FIG. 20 illustrates an example of the graph convolutional network according to the third embodiment.

As described above, the information processing apparatus 100 converts the feature matrix by performing principal component analysis. Through this principal component analysis, the feature value of one node is suitably reflected on the feature value of another node that is away from the one node. Thus, it is possible to reduce the number of graph convolutional operations for propagating the feature value of a certain node to its neighboring nodes. Thus, the graph convolutional network 137 according to the third embodiment includes only one graph convolutional layer.

The graph convolutional network 137 includes a graph convolutional layer 161, a non-linear activation layer 162, and a fully connected layer 169. The graph convolutional layer 161 receives a feature matrix having a size of n×m. This 'm' is the number of post-compression dimensions and is less than 9n+3. The non-linear activation layer 162 is located after the graph convolutional layer 161. The non-linear activation layer 162 converts the feature values by using the hyperbolic tangent function tanh. The fully connected layer 169 is located after the non-linear activation layer 162. The fully connected layer 169 outputs a displacement matrix having a size of n×3.

FIG. 21 illustrates examples of a per-node feature number with respect to the number of nodes.

A table 48 indicates examples of the number of nodes, the number of feature values per node, the number of non-zero feature values per node, the number of feature values per node after the principal component analysis. If the number n is increased from 28, 60, 130, 260, 516, 1035, 2238, 4473, to 9162, the number of feature values per node linearly increases in accordance with 9n+3.

However, the number of non-zero feature values among the 9n+3 feature values is small and does not increase in line with the increase of the number n. This is because, even if the number n increases, the number of neighboring nodes per node increases only slightly due to locality and the stiffness matrix 143 is similar to a diagonal matrix. The number of feature values per node after the principal component analysis is dropped to about $\frac{1}{13}$ of the number of feature values per node before the principal component analysis. With this number of feature values, 95% of the variance is maintained.

Figure 22:
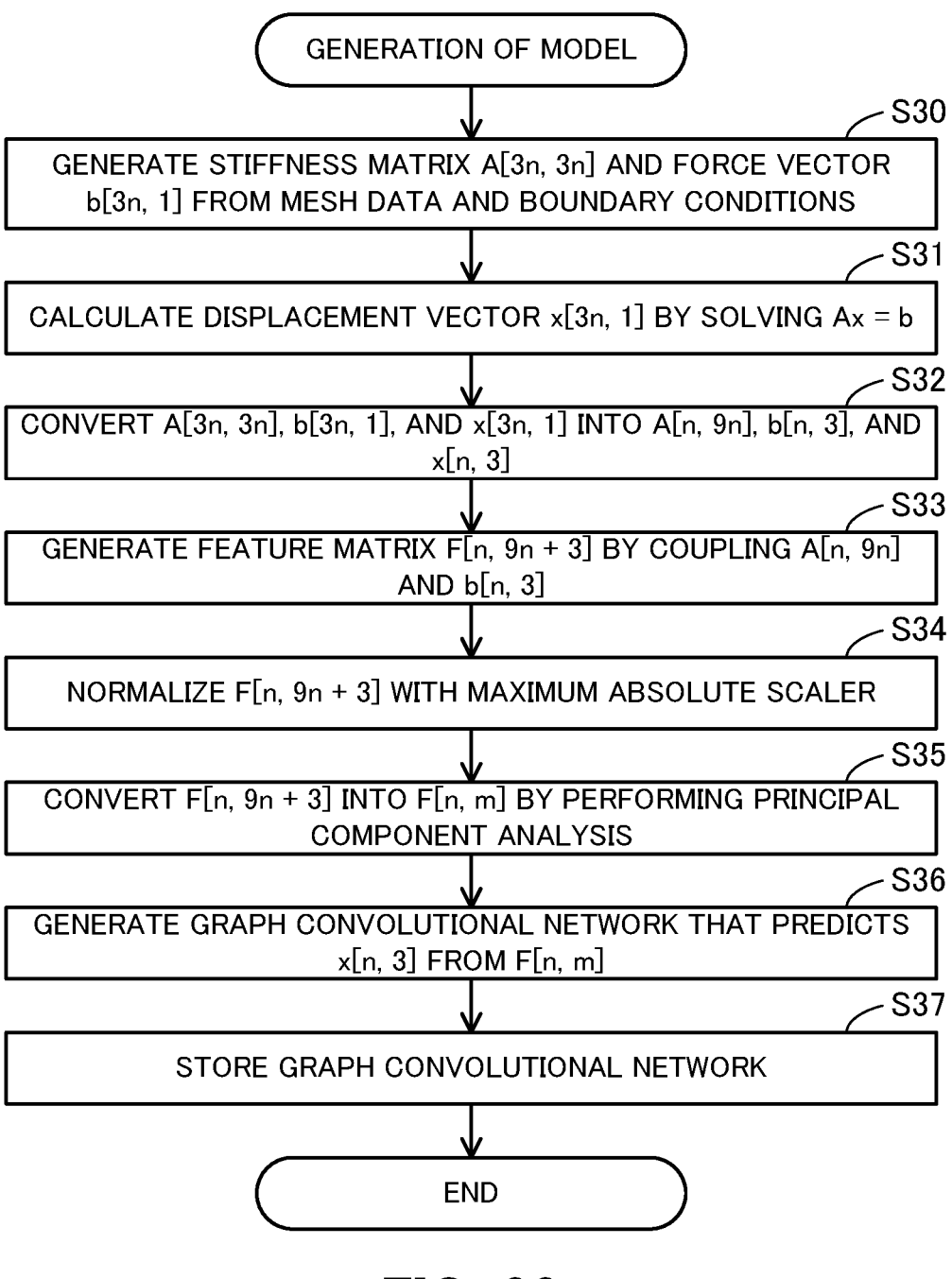
FIG. 22 is a flowchart illustrating an example of a model generation procedure according to the third embodiment.

FIG. 22 is a flowchart illustrating an example of a model generation procedure according to the third embodiment.

(S30) The discretization unit 124 generates a 3n>3n stiffness matrix A and a 3n×1 force vector b from mesh data and boundary condition data.

(S31) The linear solver 125 solves a simultaneous linear equation Ax=b from A and b generated in step S30 in accordance with an iterative method, to calculate a 3n×1 displacement vector x.

(S32) The feature extraction unit 126 converts the 3n×3n stiffness matrix A into an n×9n stiffness matrix A, converts the 3n×1 force vector b into an n×3 force matrix b, and converts the 3n×1 displacement vector x into an n×3 displacement matrix x.

(S33) The feature extraction unit 126 horizontally couples the n×9n stiffness matrix A and the n×3 force matrix b, to generate an n×(9n+3) feature matrix F.

(S34) The feature extraction unit 126 normalizes the feature matrix F generated in step S33 with a maximum absolute scaler. The normalization is performed per column, and each of the feature values is consequently in the range between −1 and 1, inclusive.

(S35) The feature extraction unit 126 performs principal component analysis on the normalized n×(9n+3) feature matrix F, which is consequently converted into an n×m feature matrix F. 'm' that indicates the number of compressed features may be determined based on the number n or may be determined such that the variance exceeds a reference value. The feature extraction unit 126 combines the feature matrix F and the displacement matrix x, to generate training data.

(S36) The machine learning unit 127 generates a graph convolutional network that predicts an n×3 displacement matrix x from an n×m feature matrix F by using the training data generated in step S35. The graph convolutional network may include only one graph convolutional layer.

(S37) The machine learning unit 127 stores the generated graph convolutional network.

Figure 23:
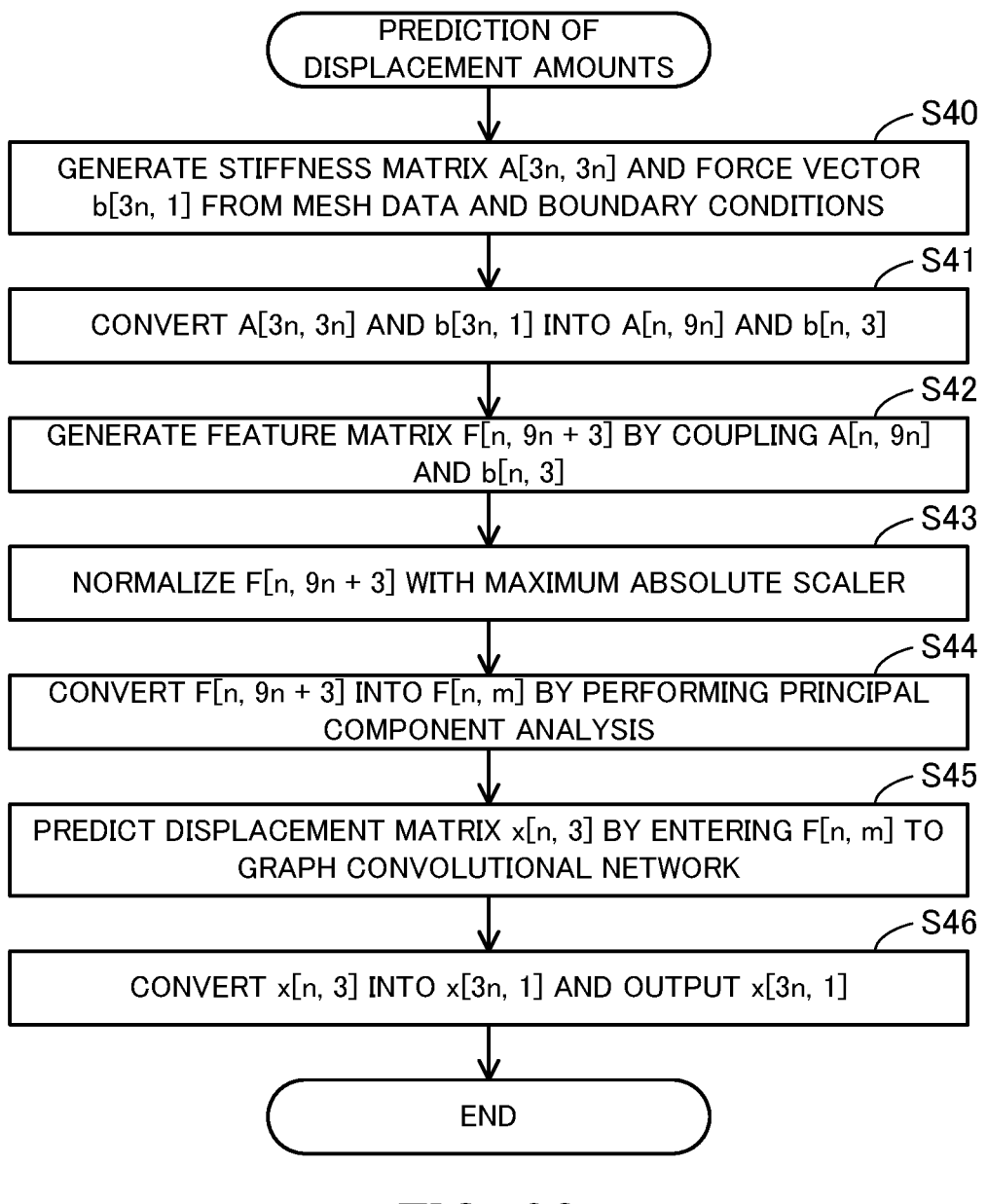
FIG. 23 is a flowchart illustrating an example of a displacement amount prediction procedure according to the third embodiment.

FIG. 23 is a flowchart illustrating an example of a displacement amount prediction procedure according to the third embodiment.

(S40) The discretization unit 124 generates a 3n×3n stiffness matrix A and a 3n×1 force vector b from mesh data and boundary condition data.

(S41) The feature extraction unit 126 converts the 3n×3n stiffness matrix A into an n×9n stiffness matrix A and converts the 3n×1 force vector b into an n×3 force matrix b.

(S42) The feature extraction unit 126 horizontally couples the n×9n stiffness matrix A and the n×3 force matrix b, to generate an n×(9n+3) feature matrix F.

(S43) The feature extraction unit 126 normalizes the feature matrix F generated in step S42 with a maximum absolute scaler. The normalization is performed per column, and each of the feature values is consequently in the range between −1 and 1, inclusive.

(S44) The feature extraction unit 126 performs principal component analysis on the normalized n×(9n+3) feature matrix F, which is consequently converted into an n×m feature matrix F.

(S45) The prediction unit 128 enters the n×m feature matrix F to the graph convolutional network, to predict an n×3 displacement matrix x.

(S46) The prediction unit 128 converts the n×3 displacement matrix x into a 3n×1 displacement vector x. The prediction unit 128 outputs the displacement vector x.

As described above, the information processing apparatus 100 according to the third embodiment reduces the size of the feature matrix to be entered to the graph convolutional network. In this way, the information processing apparatus 100 is able to perform graph convolutional operations by using a memory, such as a GPU memory, having a limited storage capacity. In addition, the calculation amount of the graph convolutional network is reduced.

In addition, the information processing apparatus 100 reduces the size of the feature matrix through the normalization and the principal component analysis. As a result, the feature vectors of the individual nodes are derived in view of the original feature matrix as a whole, and information loss is reduced. In addition, information about distant nodes is reflected on the feature vector of the individual node to some extent. Thus, the prediction accuracy of the graph convolutional network is improved. In addition, a high prediction accuracy is maintained even if the number of graph convolutional operations is reduced. That is, the graph convolutional network is achieved as a compact model having a small number of layers.

In addition, since the normalization and the principal component analysis are performed after the stiffness matrix and the force vector are coupled to each other, the correlation between the stiffness and the force is also reflected on the feature values. As a result, the prediction accuracy is improved.

In one aspect, a faster structural analysis simulation is achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable recording medium storing therein a computer program that causes a computer to execute a process comprising:

executing, based on first mesh data including a plurality of nodes and a plurality of edges connecting the plurality of nodes and first boundary condition data indicating force applied to an object represented by the first mesh data, discretization included in a finite element method and skipping a linear solver included in the finite element method, the discretization calculating a first stiffness matrix including a plurality of stiffness values corresponding to the plurality of edges and a first force vector including a plurality of force values corresponding to the plurality of nodes, the first stiffness matrix including a plurality of first rows corresponding to the plurality of nodes and a plurality of columns corresponding to the plurality of nodes, the linear solver solving a simultaneous equation based on a result of the discretization;

generating a first feature matrix by coupling the first stiffness matrix and the first force vector, the first feature matrix including a plurality of second rows corresponding to the plurality of nodes, the generating includes rearranging the plurality of stiffness values such that stiffness values for each of the plurality of nodes are arranged in a corresponding one of the plurality of second rows; and inferring a plurality of displacement amounts corresponding to the plurality of nodes by entering the first feature matrix to a graph convolutional neural network that performs a graph convolutional operation in accordance with a connection relationship of the plurality of nodes represented by the first mesh data.

2. The non-transitory computer-readable recording medium according to claim 1, wherein the first feature data includes a plurality of feature vectors corresponding to the plurality of nodes in the plurality of second rows, and wherein the graph convolutional operation updates a feature vector of a first node by using a feature vector of a second node connected to the first node.

3. The non-transitory computer-readable recording medium according to claim 2, wherein the graph neural network includes at least one graph convolutional layer that performs the graph convolutional operation.

4. The non-transitory computer-readable recording medium according to claim 1, wherein the first feature matrix is generated such that a stiffness value and a force value relating to a single node are arranged in a single second row.

5. The non-transitory computer-readable recording medium according to claim 1, wherein the generating includes generating a plurality of feature vectors corresponding to the plurality of nodes, normalizing feature values included in the plurality of feature vectors, and reducing a number of dimensions of the plurality of normalized feature vectors by performing principal component analysis.

6. The non-transitory computer-readable recording medium according to claim 1, wherein the process further includes:

calculating a second stiffness matrix and a second force vector, based on second mesh data and second boundary condition data, the second mesh data representing an object different from the object represented by the first mesh data, calculating a displacement vector representing a solution to an equation including the second stiffness matrix and the second force vector, generating a second feature matrix by coupling the second stiffness matrix and the second force vector, and generating the graph convolutional neural network so as to infer the displacement vector from the second feature matrix.

7. An inference method comprising:

executing, by a processor, based on mesh data including a plurality of nodes and a plurality of edges connecting the plurality of nodes and boundary condition data indicating force applied to an object represented by the mesh data, discretization included in a finite element method and skipping a linear solver included in the finite element method, the discretization calculating a stiffness matrix including a plurality of stiffness values corresponding to the plurality of edges and a force vector including a plurality of force values corresponding to the plurality of nodes, the stiffness matrix including a plurality of first rows corresponding to the plurality of nodes and a plurality of columns corresponding to the plurality of nodes, the linear solver solving a simultaneous equation based on a result of the discretization;

generating, by the processor, a feature matrix by coupling the stiffness matrix and the force vector, the feature matrix including a plurality of second rows corresponding to the plurality of nodes, the generating includes rearranging the plurality of stiffness values such that stiffness values for each of the plurality of nodes are arranged in a corresponding one of the plurality of second rows; and inferring, by the processor, a plurality of displacement amounts corresponding to the plurality of nodes by entering the feature matrix to a graph convolutional neural network that performs a graph convolutional operation in accordance with a connection relationship of the plurality of nodes represented by the mesh data.

8. An information processing apparatus comprising:

a memory configured to store mesh data including a plurality of nodes and a plurality of edges connecting the plurality of nodes and boundary condition data indicating force applied to an object represented by the mesh data; and a processor configured to execute a process including:

executing, based on the mesh data and the boundary condition data, discretization included in a finite element method and skipping a linear solver included in the finite element method, the discretization calculating a stiffness matrix including a plurality of stiffness values corresponding to the plurality of edges and a force vector including a plurality of force values corresponding to the plurality of nodes, the stiffness matrix including a plurality of first rows corresponding to the plurality of nodes and a plurality of columns corresponding to the plurality of nodes, the linear solver solving a simultaneous equation based on a result of the discretization;

generating a feature matrix by coupling the stiffness matrix and the force vector, the feature matrix including a plurality of second rows corresponding to the plurality of nodes, the generating includes rearranging the plurality of stiffness values such that stiffness values for each of the plurality of nodes are arranged in a corresponding one of the plurality of second rows; and inferring a plurality of displacement amounts corresponding to the plurality of nodes by entering the feature matrix to a graph convolutional neural network that performs a graph convolutional operation in accordance with a connection relationship of the plurality of nodes represented by the mesh data.

\* \* \* \* \*